United States Patent [19]

Nath et al.

[11] Patent Number: 4,590,327
[45] Date of Patent: May 20, 1986

[54] PHOTOVOLTAIC DEVICE AND METHOD

[75] Inventors: Prem Nath, Rochester; Timothy J. Barnard, Lake Orion; Dominic Crea, Mt. Clemens, all of Mich.

[73] Assignee: Energy Conversion Devices, Inc., Troy, Mich.

[21] Appl. No.: 653,801

[22] Filed: Sep. 24, 1984

[51] Int. Cl.$^4$ .................... H01L 31/06; H01L 31/18
[52] U.S. Cl. .................................. 136/256; 136/258; 136/259; 357/30; 357/65; 357/68; 29/572; 427/74; 427/88
[58] Field of Search ............... 136/256, 258 AM, 259, 136/260–261; 357/30, 65, 68, 71; 29/572; 427/74, 88

[56] References Cited

U.S. PATENT DOCUMENTS

| | | | |
|---|---|---|---|
| 3,902,920 | 9/1975 | Jordan et al. | 136/258 PC |
| 3,943,003 | 3/1976 | Dendall | 136/256 |
| 4,252,573 | 2/1981 | Boer et al. | 136/256 |
| 4,301,322 | 11/1981 | Amick | 136/256 |
| 4,385,971 | 5/1983 | Swartz | 204/129.1 |
| 4,443,652 | 4/1984 | Izu et al. | 136/251 |
| 4,451,970 | 6/1984 | Izu et al. | 29/574 |

FOREIGN PATENT DOCUMENTS

| | | | |
|---|---|---|---|
| 56-69872 | 6/1981 | Japan | 136/258 AM |
| 58-39073 | 3/1983 | Japan | 136/258 AM |

OTHER PUBLICATIONS

N. S. Murty et al., *Thin Solid Films,* vol. 108, pp. 277–283 (1983).

Primary Examiner—Aaron Weisstuch
Attorney, Agent, or Firm—Marvin S. Siskind; Ronald W. Citkowski

[57] ABSTRACT

Disclosed is an improved photovoltaic device design and method. The design is especially useful for large area photovoltaic devices and includes a first electrode, a semiconductor body over the first electrode, a transparent electrically conductive layer over the semiconductor body and a bus grid structure in electrical contact with the conductor layer for collecting and carrying current generated by the photovoltaic device. Structure is provided for reducing the degrading effect of a low resistance current path or short in the semiconductor body.

The structure for reducing the degrading effect of a low resistance current path can be a specifically designed transparent electrically conductive layer, electrical isolation of the current carrying portions of the bus grid structure from the conductive layer, resistive connections of the current collecting fingers to the remainder of the bus grid structure, a buffered bus grid structure or a fuse-type connection or the grid or current collecting fingers which terminates when the current reaches a predetermined amount.

Methods of fabricating photovoltaic devices as disclosed herein are provided.

105 Claims, 19 Drawing Figures

PHOTOVOLTAIC DEVICE AND METHOD

FIELD OF THE INVENTION

This invention relates generally to photovoltaic devices, and especially to thin film, large area photovoltaic devices. More particularly, the present invention relates to improvements in grid structures which form part of the photovoltaic devices and are utilized to collect current produced by the devices. The invention is particularly useful for large area, deposited thin film heterojunction photovoltaic devices. The present invention also relates to a structure and method for minimizing the effect of defects (shorts) which may be present in the photovoltaic devices.

BACKGROUND OF THE INVENTION

Single crystal photovoltaic devices, especially silicon photovoltaic devices, have been utilized for some time as sources of electrical power because they are inherently non-polluting, silent, and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their amorphous counterparts; and (3) are expensive and time consuming to fabricate.

Recently, considerable efforts have been made to develop processes for depositing amorphous semiconductor films, each of which can encompass relatively large areas, and which can be doped to form p-type and n-type materials for the production of p-i-n-type devices substantially equivalent to those produced by their crystalline counterparts. It is to be noted that the term "amorphous," as used herein, includes all materials or alloys which have long range disorder, although they may have short or intermediate range order or even contain some crystalline inclusions.

For many years, such work with amorphous silicon or germanium films was substantially unproductive because of the presence therein of microvoids and dangling bonds which produce a high density of localized states in the energy gap. Initially, the reduction of the localized states was accomplished by glow discharge deposition of amorphous silicon films wherein silane ($SiH_4$) gas is passed through a reaction tube where the gas is decomposed by a radio frequency (r.f.) glow discharge and deposited on a substrate at a substrate temperature of about 500–600 degrees K. (227–327 degrees C.). The material so deposited on the substrate is an intrinsic amorphous material consisting of silicon and hydrogen. To produce a doped amorphous material, phosphine gas ($PH_3$), for n-type conduction, or diborane ($B_2H_6$) gas, for P-type conduction is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to substantially reduce the density of the localized states in the energy gap, thereby causing the amorphous material to more nearly approximate the corresponding crystalline material.

It is now possible to prepare by glow discharge or vapor deposition thin film amorphous silicon alloys in large areas that possess acceptable concentrations of localized states in the energy gaps thereof, and high quality electronic properties. Suitable techniques are fully described in U.S. Pat. No. 4,226,898, entitled "Amorphous Semiconductors Equivalent to Crystalline Semiconductors," issued in the names of Stanford R. Ovshinsky and Arun Madan on issued Oct. 7, 1980 and in U.S. Pat. No. 4,217,374, under the same title to Stanford R. Ovshinsky and Masatsugu Izu, which issued on Aug. 12, 1980 and U.S. Pat. No. 4,517,223, issued May 14, 1985 in the names of Stanford R. Ovshinsky, David D. Allred, Lee Walter and Stephen J. Hudgens entitled "Method of Making Amorphous Semiconductor Alloys and Devices Using Microwave Energy." As disclosed in these patents, it is believed that fluorine introduced into the amorphous silicon semiconductor operates to substantially reduce the density of the localized states therein and facilitates the addition of other alloying materials, such as germanium.

Activated fluorine is believed to readily diffuse into, and bond to, amorphous silicon in a matrix body to substantially decrease the density of localized defect states therein. This is thought to be due to the fact that the small size of the fluorine atoms enables them to be readily introduced into an amorphous silicon matrix. The fluorine therefore bonds to the dangling bonds of the silicon and forms a partially ionic stable bond with flexible bonding angles, which results in a more stable and more efficient compensation or alteration than could be formed by hydrogen, or other compensating or altering agents which were previously employed. Fluorine is considered to be a more efficient compensating or altering element than hydrogen when employed alone or with hydrogen, because of its exceedingly small size, high reactivity, specificity in chemical bonding, and highest electronegativity.

Compensation may be achieved with fluorine, alone or in combination with hydrogen, upon the addition of such element(s) in very small quantities (e.g., fractions of one atomic percent). However, the amounts of fluorine and hydrogen most desirably used are much greater than such small percentages, permitting the elements to form a silicon-hydrogen-fluorine alloy. Thus, alloying amounts of fluorine and hydrogen may, for example, be used in a range of 0.1 to 5 percent or greater. The alloy thus formed has a lower density of defect states in the energy gap than can be achieved by the mere neutralization of dangling bonds and similar defect states. In particular, it appears that use of larger amounts of fluorine participates substantially in effecting a new structural configuration of an amorphous silicon-containing material and facilitates the addition of other alloying materials, such as germanium. Fluorine, in addition to the aforementioned characteristics, is believed to (1) be an organizer of local structure in the silicon-containing alloy through inductive and ionic effects, and also (2) influence the bonding of hydrogen by acting to decrease the density of the defect states which hydrogen normally contributes. The ionic role that fluorine plays in such an alloy is an important factor in terms of the nearest neighbor relationships.

The concept of utilizing multiple cells, to enhance photovoltaic device efficiency, was described at least as early as 1955 by E. D. Jackson, U.S. Pat. No. 2,949,498, issued Aug. 16, 1960. The multiple cell structures therein disclosed utilized p-n junction crystalline semiconductor devices. Essentially, the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is the sum of the open circuit voltage of each cell while the short circuit current remains substantially constant.

Many publications on crystalline stacked cells following Jackson have been reported, and, recently, several articles dealing with Si-H materials in stacked cells have been published. Marfaing proposed utilizing silane deposited amorphous Si-Ge alloys in stacked cells, but did not report the feasibility of doing so. (Y. Marfaing, Proc. 2nd European Communities Photovoltaic Solar Energy Conf., Berlin, West Germany, p. 287, (1979)).

Hamakawa et al., reported the feasibility of utilizing Si-H in a configuration which will be defined herein as a cascade type multiple cell. The cascade cell is hereinafter referred to as a multiple cell without a separation or insulating layer therebetween. Each of the cells was made of a Si-H material of the same band gap as in a p-i-n junction configuration. Matching of the short circuit current ($J_{sc}$) was attempted by increasing the thickness of the cells in the serial light path. As expected, the overall device Voc increased and was proportional to the number of cells.

Due to the beneficial properties attained by the introduction of fluorine, amorphous alloys used to produce cascade type multiple cells may now incorporate fluorine as one possible method of reducing the density of localized states without impairing the electronic properties of the material. Further band gap adjusting element(s), such as germanium and carbon, can be activated and are added in vapor deposition, sputtering, or glow discharge processes. The band gap is adjusted as required for specific device applications by introducing the necessary amounts of one or more of the adjusting elements into the deposited alloy cells in at least the photocurrent generation region thereof. Since the band gap adjusting element(s) has been tailored into the cells without adding substantial deleterious states, because of the influence of fluorine, the cell material maintains high electronic qualities and photoconductivity when the adjusting element(s) are added to tailor the device wavelength characteristics for a specific photoresponsive application. The addition of hydrogen, either with fluorine or after deposition, can further enhance the fluorine compensated or altered alloy. The post deposition incorporation of hydrogen is advantageous when it is desired to utilize the higher deposition substrate temperatures allowed by fluorine.

It is of obvious commercial importance to be able to mass produce photovoltaic devices such as solar cells. However, with crystalline cells, mass production was limited to batch processing techniques by the inherent time consuming growth requirements of the crystals. Unlike crystalline silicon which is limited to batch processing for the manufacture of solar cells, amorphous silicon semiconductor alloys can be deposited in multiple layers over large area substrates to form solar cells in a high volume, continuous processing system. Continuous processing systems of this kind are disclosed, for example, in pending U.S. Pat. Nos. 4,400,409, entitled "A Method of Making P-Doped Silicon Films and Devices Made Therefrom," 4,542,711 entitled "Continuous Systems For Depositing Amorphous Semiconductor Material," 4,410,558 entitled "Continuous Amorphous Solar Cell Production System," 4,438,723 entitled "Multiple Chamber Deposition and Isolation System and Method," 4,492,181 entitled "Method And Apparatus For Continuously Producing Tandem Amorphous Photovoltaic Cells," and 4,485,125, entitled "Method And Apparatus For Continuously Producing Tandem Amorphous Photovoltaic Cells." As disclosed in these patents, a substrate may be continuously advanced through a succession of deposition chambers, wherein each chamber is dedicated to the deposition of a specific semiconductor material. In making a solar cell of p-i-n-type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy.

Since each deposited semiconductor alloy, and especially the intrinsic semiconductor alloy, must be of high purity; (1) the deposition environment in the intrinsic deposition chamber is isolated, by specially designed gas gates, from the doping constituents within the other chambers to prevent the diffusion of doping constituents into the intrinsic chamber; (2) the substrate is carefully cleansed prior to initiation of the deposition process to remove contaminants; (3) all of the chambers which combine to form the deposition apparatus are sealed and leak checked to prevent the influx of environmental contaminants; (4), the deposition apparatus is pumped down and flushed with a sweep gas to remove contaminants from the interior walls thereof; and (5) only the purest reaction gases are employed to form the deposited semiconductor materials. In other words, every possible precaution is taken to insure that the sanctity of the vacuum envelope formed by the various chambers of the deposition apparatus remains uncontaminated by impurities, regardless of origin.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained.

As is obvious from the foregoing, thin film amorphous semiconductor materials offer several distinct advantages over crystalline materials, insofar as they can be easily and economically fabricated by the newly developed mass production processes. However, in the fabrication of semiconductor material by the aforementioned processes, the presence of current-shunting defects has been noted. These defects have (1) seriously impaired the performance of the photovoltaic devices fabricated therefrom and (2) detrimentally affected production yield. These process-related defects are thought to either (1) be present in the morphology of the substrate electrode, or (2) develop during the deposition of the semiconductor layers. It is to the end of eliminating, or at least substantially reducing the effects of these current-shunting defects to which the instant invention is directed.

The most important of these defects may be characterized as "shunt", "short-circuit" defects, defect regions or low resistance current paths. Before the suspected causes of these defects are explained, it is helpful to note the thicknesses of the deposited semi-conductor layers. A typical "p" layer may be only on the order of 400 angstroms thick, a typical "i" layer may be only on the order of 3,500 angstroms thick, and a typical "n" layer may be only on the order of 200 angstroms thick, thereby providing a total semiconductor body thickness of only about 4,100 angstroms. It should therefore be appreciated that irregularities, however small, are not easy to cover by the deposited semiconductor layers.

Shunt defects are present when one or more low resistance current paths develop between the electrodes of the photovoltaic device. Under operating conditions, a photovoltaic device in which a shunt defect has developed, exhibits either (1) a low power output, since electrical current collected at the electrodes thereof flows through the defect region (the path of least resistance) in preference to an external load, or (2) complete failure where sufficient current is shunted through the defect region to "burn out" the device.

While shunt-type defects always deleteriously affect the performance of photovoltaic devices, their effect is greatest when the devices in which they are incorporated are operated under relatively low illumination, such as room light, vis-a-vis, high intensity illumination such as AM 1. This occurs because, in a photovoltaic device, photo-generated current increases linearly with increasing illumination, while the resulting voltage increases exponentially with increasing illumination. In other words, voltage attains a relatively high value under low illumination, the value increasing only slightly as the intensity of the illumination is increased. The result is that under low illumination a relatively high voltage potential is present, said potential adapted to preferentially drive the relatively small number of current carriers through the path of least resistance, i.e., the low resistance defect regions. In contrast thereto, under high illumination, a large number of current carriers are present and are driven by a potential of about the same magnitude as the potential which exists under low illumination. This larger number of current carriers compete for a limited number of least resistance paths (through the defect regions). The result is that at high intensity, while about the same amount of power may be lost to the defect region, the power lost is a smaller percentage of the total power produced than at low intensity illumination.

Defects or defect regions, the terms being interchangeably used herein, are not limited to "overt" or "patent" short circuit current paths. In some cases, the adverse effects of a defect are latent and do not immediately manifest themselves. Latent defects can give rise to what will be referred to hereinafter as an "operational mode failure", wherein a photovoltaic device, initially exhibiting satisfactory electrical performance, suddenly fails. The failures will be referred to in this application as operational mode failures regardless of whether the device was previously connected to a load for the generation of power, it only being necessary that the device was, at some time, subjected to illumination, thereby initiating the generation of carriers. This type of failure will be discussed in further detail hereinbelow. It is believed the shunt defects, both latent and patent, arise from one or more irregularities in the (1) morphology of the substrate material, or (2) in the growth of the semiconductor layers.

The first, and perhaps most important, source of the defects, i.e., the aforementioned morphological irregularities in the deposition surface of the substrate material will now be discussed. Even though the highest quality stainless steel is employed to serve as the substrate or base electrode upon which the semiconductor layers are successively deposited, such substrates have been found to have as many as 10,000 irregularities per square centimeter on the deposition surfaces thereof. Such irregularities take the form of projections, craters, or other deviations from a smooth finish and may be under a micron in (1) depth below the surface, (2) height above the surface, or (3) diameter. Regardless of their configuration or size, the defect may establish a low resistance current path through the semiconductor body, thereby effectively short circuiting the two electrodes. This may occur in numerous ways. For instance, a spike projecting from the surface of the substrate electrode may be of too great a height to be covered by the subsequent deposition of semiconductor layers, and therefore, be in direct electrical contact with the other electrode when that electrode is deposited atop the semiconductor layers. Likewise, a crater formed in the surface of the substrate electrode may be of too small a size to be filled by the subsequent deposition of semiconductor layers and therefore, be in sufficient proximity to the other electrode, when that electrode is deposited atop the semiconductor layers, for electrical current to either (1) bridge the gap which exists between the electrodes, or (2) through actual use (the photoinduced generation of electrical current) of the photovoltaic device, cause the material of one of the electrodes to migrate toward and contact the other of the electrodes, and thereby pass electrical current therebetween. It is also possible that the semiconductor layers deposited onto the substrate are of poor quality, thereby providing a low resistance path for the flow of electrical current between the electrodes of the photovoltaic device.

Further, despite all the previously described efforts to maintain the vacuum envelope free of external contaminants; dust or other particular matter, which somehow either (1) invades the vacuum envelope during the deposition of the semiconductor material, or (2) forms as a by-product of the deposition process and is deposited over the substrate electrode along with the semiconductor material. The contaminants interfere with the uniform deposition of the semiconductor layers and may establish the low resistance current path through which electrical current either (1) directly communicates, or (2) may, through operation of the device, develop communication with the two electrodes. Additionally, it is suspected that in some cases, the semiconductor material may form micro-craters or micro-projections during the deposition thereof, even absent the presence of contaminants or pollutants from external sources. Again, such morphological deviation from a perfectly smooth and even surface means that the substrate is covered by semiconductor material either (1) in an "ultra thin layer" (consider again that the total thickness of all semiconductor layers is only on the order of 4,000 angstroms and any reduction in coverage is indeed an ultra thin layer) or (2) not at all. Obviously, when the upper electrode material is deposited across the entire surface of the semiconductor body, the defect regions cause the low resistance current path to develop, and electrical current is shunted therethrough. In still other cases involving defect regions, the presence of such defect regions is only detectable due to their deleterious effect upon the electrical and photoelectric properties of the resultant photovoltaic device. Finally, note the defects described hereinabove may not be sufficiently severe to divert all electrical current through the low resistance path. However, the diversion or shunting of any current therethrough represents a loss in operational efficiency of the photovoltaic device and should therefore be eliminated. Moreover, the shunting of even small amounts of current through each of thousands of defect regions may combine to cause major losses in efficiency. Based upon the foregoing, it should be apparent that a reduction in current flow through these defects and defect regions is critical to the fabrication of high-yield, high efficiency, large area thin film photovoltaic devices.

Several approaches dealing with gross amplifications of this problem have been implemented by Applicants and their colleagues. As described in U.S. Pat. No. 4,451,970, of Masatsugu Izu and Vincent Cannella, entitled "System and Method For Eliminating Short Circuit Current Paths In Photovoltaic Devices," said patent assigned to the assignee of the instant application, the shunting of current through defect regions is treated by substantially eliminating the defect regions as an operative area of the semiconductor device. This is accomplished in an electrolytic process where electrode material is removed from the periphery of the defect site, effectively isolating the defect region and preventing the flow of electrical current through the defect region. However, the process described in the aforementioned patent is current dependent, i.e., the greater the current flowing through a particular area of the device, such as a defect region, the greater the amount of electrode material (in the preferred embodiment indium tin oxide) is removed. Consequently, said short circuit eliminating process performs admirably in removing the electrode material from the periphery of a large defect, and thereby preventing all current flow therethrough. However, it is not as successful in eliminating the flow of current between the electrodes in the thousands of defect regions which are relatively small. And, as previously mentioned, since a great many of relatively small current shunting paths, taken in toto, divert a substantial amount of current from its desired path of travel through the semiconductor layers, the flow of current through the low resistance current paths created by such small defect regions must also be eliminated or at least substantially reduced. Further, the electrolytic process described in the '890 application neither detects nor helps in preventing the formation of current-shunting paths in the case of operational mode failures.

In U.S. Pat. No. 4,419,530 issued in the name of Prem Nath, entitled "Improved Solar Cell and Method For Producing Same", and assigned to the assignee of the instant patent application, there is described a method for electrically isolating small area segments of an amorphous, thin film, large area photovoltaic device. This is accomplished by (1) dividing the large area device into a plurality of small area segments, (2) testing the small area segments for electrical operability, and (3) electrically connecting only those small area segments exhibiting a predetermined level of electrical operability, whereby a large area photovoltaic device comprising only electrically operative small area segments is formed. One cause of the electrical inoperability (failure of the device to meet predetermined minimum specifications) of small area segments is the presence of defect regions which operate to shunt current through low resistance paths. The method of solving the problem of defect regions in the '530 patent, while effective, eliminates rather large sections of the photovoltaic device. The output of the device is significantly reduced as compared to the output which could be realized if only the precise defect region was eliminated.

While the method of dividing a relatively large area solar cell into electrically isolated portions and thereafter only connecting those portions which have satisfactory output is effective in reducing or eliminating the effect of defects, this concept is not completely satisfactory for several reasons.

The step of dividing the semiconductor body of the solar cell into electrically isolated portions requires several production steps and also reduces the total area of the solar cell that is available for producing electrical energy. Further, the method can be time and cost intensive since the electrical output of each isolated portion is tested and then separate electrical connections are made to an electrical contact for each small area to transmit the current produced by the device. In addition, since it is possible that defects (shorts) in a solar cell can develop after the cell has been in use, the concept of dividing the body of the large area cell does not make compensation for this type of defect.

Further, both of the foregoing patent applications relate to "after market" techniques which are applicable to (1) isolate only gross defect-containing regions of a photovoltaic device, and (2) prevent any and all current flow through those defect containing regions. Accordingly, a need still exists for a photovoltaic device which substantially eliminates the deleterious effect or shunt defects, both large and small, whatever their origin, without operatively removing large portions of the active semiconductor body, and while maintaining an acceptable level of current flow across the entire surface of the device.

In order to more efficiently make and utilize large area photovoltaic devices, it would be desirable to provide an improved solar cell and method in which the effects of any shunt defects (shorts) in the cell, either when fabricated or which later develop after use, are minimized without the necessity of dividing a large area solar cell into a plurality of electrically isolated portions. In addition, a need exists for an improved solar cell which can be more easily fabricated on a large scale. Finally, a need exists for improvements in collecting current generated by solar cells so that the current is uniformly collected across the area of the cell.

SUMMARY OF THE INVENTION

In accordance with a broad aspect of the present invention, an improved photovoltaic device is provided that includes an electrically conductive substrate or first electrode, a semiconductor body over the substrate, a current collecting portion or layer that is usually a transparent electrically conductive layer or second electrode over at least a portion of the semiconductor body, an electrode grid or bus grid structure in electrical contact with the conductive layer for collecting and carrying current generated by the photovoltaic device and structure for reducing the degrading effect of a low resistance current path in the semiconductor body on the electrical performance of the photovoltaic device.

While an electrically conductive layer is usually the current collecting portion or layer, any type of layer or portion which performs this function, whether as part of the semiconductor body for example, or as a separate layer, can be utilized in accordance with the invention. The design of the photovoltaic device is especially suited for large area devices, on the order of 100 cm$^2$ or more, for example.

It is to be understood that in accordance with the invention, the semiconductor body may be any suitable semiconductor material. Suitable semiconductor materials are those which can be formed into thin films and include, by way of example only, and not as a limitation on the present invention, silicon based, cadmium sulfide based, and cadmium tellurium based semiconductor materials.

In accordance with one aspect of the present invention, the structure for reducing the degrading effect of low resistance current paths in the semiconductor body is a transparent conductive layer having a relatively high sheet resistance.

In accordance with this aspect of the present invention, an improved photovoltaic device is provided that includes an electrically conductive substrate layer, a semiconductor body over the substrate layer, and a transparent conductive layer in contact with the semiconductor body. The transparent conductive layer has a relatively high sheet resistance for reducing the current sinking effect caused by a defect (short) in the photovoltaic device. Generally, in accordance with this embodiment, the sheet resistance of the conductive layer will be at least about 300 ohms/square. Generally, a bus grid structure will be utilized in connection with this embodiment, especially when the photovoltaic device is of sufficiently large surface area or where the conductivity of the conductive layer is insufficient to provide a suitable carrier path for collecting current produced by the device. The design of the bus grid structure should be tailored to optimally collect current for a particular sheet resistance. A relatively high resistance conductive layer requires closer spacing for the current collecting portions or fingers of the grid. The grid finger spacing and pattern should be optimized for a particular conductive layer resistance to provide uniform current collecting from the device while providing adequate protection from low resistance current paths which may be present in the semiconductor body. In accordance with this embodiment, the photovoltaic device does not have to be divided into electrically isolated portions, as in U.S. Pat. No. 4,419,530, to satisfactorily minimize the effect of low resistance current paths. This is a significant advantage since fabrication time is reduced and cost intensive processing steps are eliminated.

In one aspect of the invention, the structure for reducing the degrading effect of a low resistance current path in the semiconductor body includes a bus grid structure that comprises a current collecting portion including grid fingers and a current carrying portion comprising a busbar structure for carrying current collected by the current collecting portion wherein the current carrying portion is electrically insulated from the conductive layer.

In accordance with another aspect of the structure for reducing the degrading effect of a low resistance current path, a bus grid structure is provided that includes a plurality of grid fingers for collecting current and a busbar structure for carrying current collected by the grid fingers wherein each of the grid fingers is resistively connected to the busbar structure so that the current carrying capability between the busbar structure and the grid fingers is, for each grid finger, limited to a predetermined amount as desired. This amount will usually be a factor of about five times or less than the amount of current which can be produced by the area of the photovoltaic device for which that particular grid finger collects current. Generally, the factor will be related to the cell area for which a particular finger collects current. For example, if a finger collects current from a relatively large area, the factor will generally be less than for a finger that collects current from a relatively small area.

In accordance with another embodiment of the broad aspect of the invention, the bus grid structure includes a plurality of grid fingers for collecting current and a busbar structure for carrying current collected by the grid fingers and the structure for reducing the degrading effect comprises grid fingers being electrically connected to the busbar structure with a destructible or fuse-type connection such that when the current through the destructible connection reaches a predetermined amount, the destructible connection terminates. The predetermined amount can be fixed as desired, and is usually, for each grid finger, slightly greater (for example, a factor of about 1.2) than the maximum amount of current which can be produced by the area of the photovoltaic device for which that particular grid finger collects current.

In accordance with this aspect of the present invention, the photovoltaic device includes an electrically conductive substrate layer or first electrode, a semiconductor body deposited on the substrate layer, a transparent conductive layer or second electrode over at least a portion of the semiconductor body and a bus grid structure in electrical contact with the conductive layer. The bus grid structure includes a plurality of grid fingers for collecting current and a busbar structure for carrying current collected by the grid fingers. Each of the grid fingers is electrically connected to the busbar structure with a destructible connection. If the amount of current carried between a grid finger and the busbar structure is above a predetermined limit for that grid finger, its destructible connection to the busbar structure terminates. In accordance with this embodiment, the destructible connection may comprise fusible material, such as fusible metal, for example.

In accordance with still another embodiment of the present invention, the structure for reducing the degrading effect of a low resistance current path in the semiconductor body is a bus grid having a buffered bus grid structure. As used herein the term "buffered bus grid structure" or "buffered pattern" means that the current collecting portions or fingers of the grid are unbranched and are directly coupled to the major busbar of the photovoltaic device. The need for a minor busbar is eliminated.

In accordance with this embodiment of the present invention, the photovoltaic device includes an electrically conductive substrate layer or first electrode, a semiconductor body deposited over the substrate layer, a transparent conductive layer or second electrode over at least a portion of the semiconductor body for facilitating collection of electrical current produced by the photovoltaic device and a bus grid structure, in contact with the conductive layer. The bus grid structure in accordance with this embodiment includes a busbar structure for carrying current and a plurality of unbranched grid fingers for collecting current, each of the grid fingers being directly electrically connected to the major busbar. The grid fingers are arrayed in a buffered pattern and eliminate the need for a minor busbar which generally forms part of the busbar structure together with a major busbar.

For large area photovoltaic devices in accordance with the invention, as a general proposition, the bus grid structure is designed in such a way that any small area on the photovoltaic device has current accessability only through a path that is highly resistant in terms of high current but is sufficiently conductive for the relatively low current being generated by the same small region of the photovoltaic device. Thus, in accordance with the invention, any paths from any small area of the photovoltaic device directly to a high current capability path, such as a major or minor busbar, are avoided. Preferably, any small area of the photovoltaic device should be accessible to only the smallest or thinnest grid fingers of the entire bus grid structure.

It is to be understood that the foregoing improvements can be combined in a single photovoltaic device to the extent that the combination is not impractical.

In accordance with the method aspects of the present invention, improved methods of fabricating photovoltaic devices are provided. Each of these methods is especially useful for making deposited photovoltaic devices, particularly large area, thin film photovoltaic devices.

In accordance with one embodiment of the method of the present invention, a method of fabricating a photovoltaic device is provided. The photovoltaic device is of the type that includes an electrically conductive substrate or first electrode, a semiconductor body over the substrate and a transparent conductive layer over at least a portion of the semiconductor body and a bus grid structure wherein the bus grid structure includes a current collecting portion including a plurality of grid fingers and a current carrying portion for carrying current collected by the grid fingers. In accordance with the method, a semiconductor body is deposited over an electrically conductive substrate. Thereafter, a transparent conductive oxide layer is deposited over at least a portion of the semiconductor body. An insulating material is deposited to form an insulating layer in a pattern and location corresponding to the areas in which the current carrying portion of the bus grid structure is to be deposited. Thereafter, the current carrying portion of the bus grid structure is deposited so that the current carrying portion is electrically insulated from the conductive layer. The current collecting portion of the bus grid structure is deposited so that it is in electrical contact with the conductive layer when both the grid fingers and the conductive layer have been deposited. In accordance with this method, the conductive layer is deposited prior to depositing the insulating material.

In accordance with another aspect of the method of the present invention, a method for fabricating a photovoltaic device of the type previously described that includes a second electrode or bus grid structure wherein the bus grid structure includes a current collecting portion including a plurality of grid fingers and a current carrying portion for carrying current collected by the grid fingers in which each of the grid fingers is separately electrically connected to the current carrying portion with a resistive connection which limits the amount of current which can be carried between each of the grid fingers and the current carrying portion of the photovoltaic device. In accordance with this method, a semiconductor body is deposited over an electrically conductive substrate and thereafter a transparent conductive layer is deposited over at least a portion of the semiconductor body. The current collecting and current carrying portions of the bus grid structure are then deposited so that the current collecting portion is in electrical contact with the conductive layer and wherein the grid fingers are electrically connected to the current carrying portion with a resistive connection for each grid finger so that the current carrying capability of each of the grid fingers between the current carrying portion is a desired amount, usually about five times or less than the amount of current which is produced by the area of the photovoltaic device for which a particular grid finger collects current.

In accordance with present invention, there is no need to isolate the conductive layer into electrically discrete portions to reduce the degrading effect of low resistance current paths in the semiconductor body. The combination of a relatively high resistance conductive layer, insulated current carrying portions of the bus grid structure and optimally spaced grid fingers for collecting current can result in a photovoltaic device that is adequately protected from low resistance current paths in the semiconductor body so as not to require any other safeguards from the low resistance current paths.

BRIEF DESCRIPTION OF THE DRAWINGS

The present invention can be more completely understood by reference to the accompanying drawings in which.

DETAILED DESCRIPTION

Figure 1:
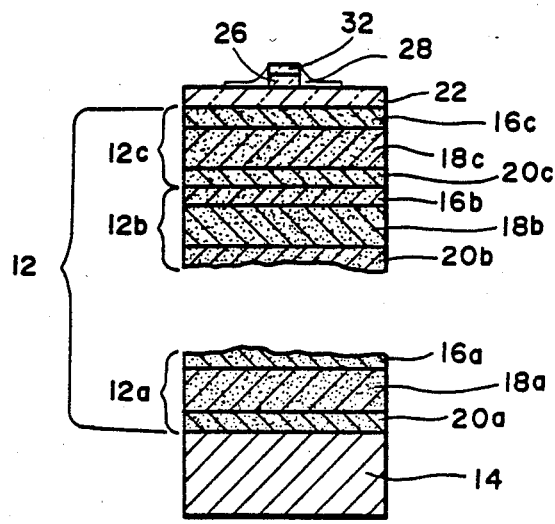
FIG. 1 is a fragmentary, cross-sectional view of a tandem or cascade photovoltaic device comprising a plurality of p-i-n-type cells, each layer of cells formed from an amorphous, semiconductor alloy.

Referring now to the drawings, where like reference numbers designate like structure, and particularly to FIG. 1, a stacked, tandem, or cascade-type, photovoltaic device, formed of successive p-i-n layers each including an amorphous semiconductor alloy, is shown generally by the reference numeral 10. One of the methods described in the present invention, is, in the preferred embodiment, adapted to produce an improved photovoltaic device of this type. However, that method and other methods, also described herein, are not limited solely to the production of stacked p-i-n photovoltaic cells, but are of equal value in the production of any other type of thin film solar cells, improved Schottky or improved MIS (metal-insulator-semiconductor) type cells or simply the production of improved semiconductor devices. Regardless of cell type, the novel production methods described herein have their greatest utility in connection with photovoltaic devices formed with uniform layers of semiconductor materials and with a uniform, continuous transparent conductive layer deposited over the semiconductor layers.

It is to be understood that in accordance with the invention, the semiconductor body may be any suitable semiconductor material. Suitable semiconductor materials are those which can be formed into thin films and include, by way of example only, and not as a limitation on the present invention, silicon based, cadmium sulfide based, and cadmium tellurium based semiconductor materials.

FIG. 1 shows a semiconductor body 12 consisting of a plurality of p-i-n photovoltaic cells 12a, 12b, and 12c. Below lowermost cell 12a is a substrate 14 which may be transparent or formed with a metallic surface foil. Although certain applications may require a thin oxide layer and/or a series of base contacts prior to the application of the amorphous material, for the purpose of this application the term substrate shall include not only a flexible film but also any elements added thereto by preliminary processing. Most commonly, substrate 14 may be formed of stainless steel, aluminum, tantalum, molybdenum, or chrome, or an insulating material such as glass with a conductive coating formed thereover. Although certain applications may require a thin oxide layer and/or a series of base contacts prior to deposition of the semiconductor material, for purposes of this application, the term, "substrate" shall include not only a flexible film, but also any elements added thereto by preliminary processing.

As illustrated, each of cells 12a, 12b, and 12c includes an amorphous alloy body containing at least a silicon alloy. Each of the alloy bodies includes an n-type region or layer (16a, 16b, and 16c); an intrinsic region or layer (18a, 18b, and 18c); and a p-type region or layer (20a, 20b, and 20c). As illustrated, cell 12b is an intermediate cell and, as indicated in FIG. 1, additional intermediate cells may be stacked atop the illustrated cells without departing from the spirit or scope of the present invention. Also, although stacked p-i-n cells are illustrated, this invention is equally adapted for single or stacked n-i-p cells.

For each of cells 12a, 12b, and 12c, the p-type layers are characterized by low light absorption, high conductivity alloy layers. The intrinsic alloy layers are characterized by an adjusted wavelength threshold for a solar photoresponse, high light absorption, low dark conductivity and high photoconductivity including sufficient amounts of a band gap adjusting element or elements to optimize the band gap for the particular cell application. Preferably, the intrinsic layers are band gap adjusted to provide cell 12a with a lowest band gap, cell 12c with the highest band gap, and cell 12b with a band gap between the other two. The n-type layers are characterized by low light absorption, high conductivity alloy layers. The thickness of the n-type layers is preferably in the range of about 25 to 500 angstroms. The thickness of the band gap adjusted, amorphous intrinsic alloy layers is preferably between about 2,000 angstroms to 30,000 angstroms. The thickness of the p-type layers is preferably between 50 to 500 angstroms. Due to the shorter diffusion length of the holes, the p-type layers generally will be as thin as possible. Further, the outermost layer, here p-type layer 16c, will be as thin as possible to avoid absorption of light and need not include the band gap adjusting element or elements.

Following the deposition of the semiconductor layers, a further deposition process may be either performed in a separate environment or as a part of a continuous process. In this step, a transparent electrically conductive layer 22, formed in the preferred embodiment of indium tin oxide, also referred to herein as the top or second electrode, is deposited over the semiconductor material. An electrode grid or bus grid structure 24 may be applied to the device where the cell is of a sufficiently large area, or if the conductivity of conductive layer 22 is insufficient. Bus grid structure 24 shortens the carrier path through the conductive layer and thus increases the collection efficiency.

Figure 2:
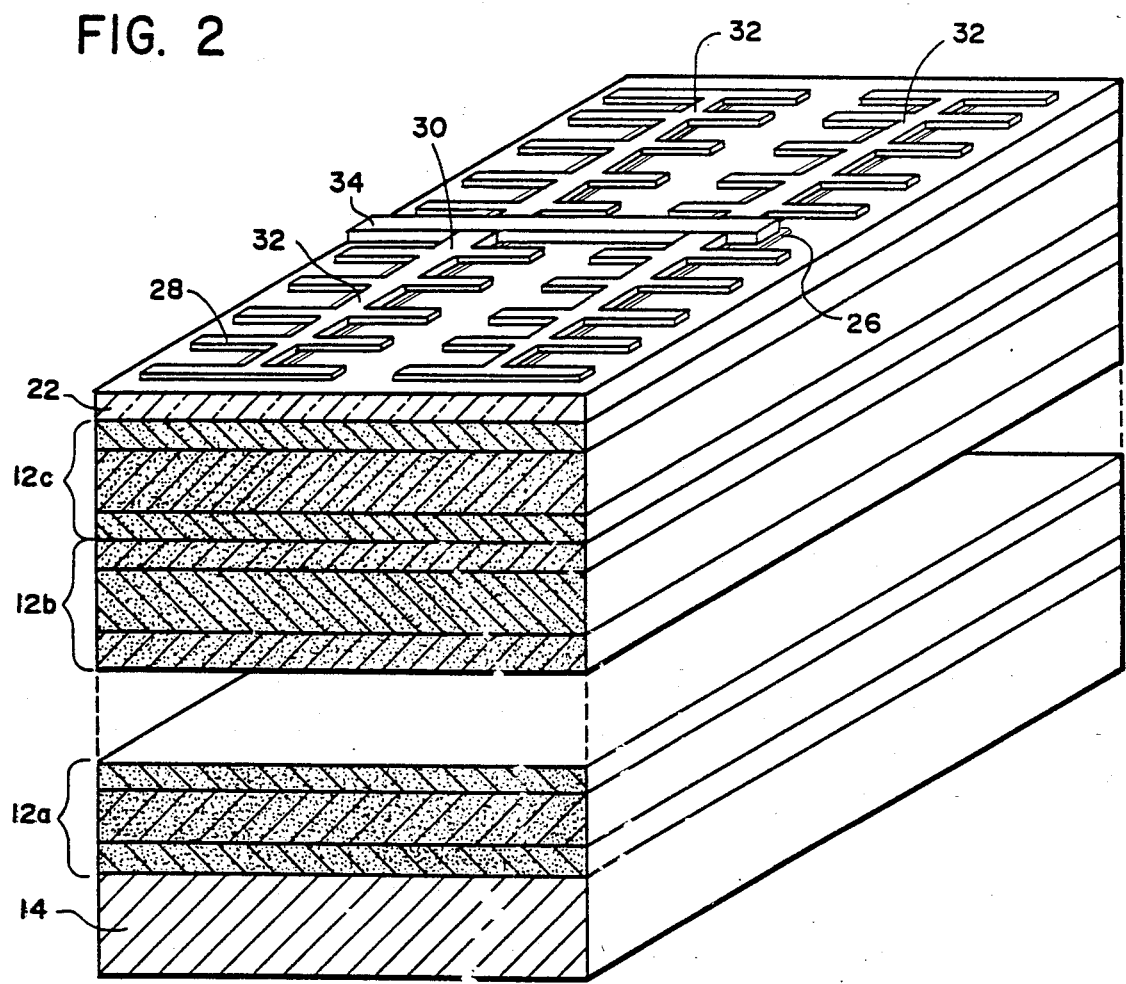
FIG. 2 is a cross-sectional, perspective view of the photovoltaic device of FIG. 1.

Between conductive layer 22 and portions of bus grid structure 24 is a layer of insulating material 26. Bus grid structure 24 includes a current collecting portion, consisting of grid fingers 28 and a current carrying portion, consisting of a busbar structure 30, which is insulated from semiconductor body 12, as more clearly illustrated in FIG. 2. Busbar structure 30 includes a minor busbar 32 and a major busbar 34. Since busbar structure 30 is insulated from transparent conductive layer 22, no current can be collected by busbar structure 30. Similarly, if a short or low resistance current path is proximate busbar structure 30, no current can be sinked to the short through busbar structure 30, thereby reducing the degrading effect on the electrical performance of the photovoltaic device should such a short be present or should one develop.

While the cell illustrated in FIG. 1 is a stacked assembly of p-i-n cells, the instant invention also embodies other cell arrangements such as single p-i-n cells, stacked or single n-i-p cells, p-n cells, Schottky barrier cells, and the like. Accordingly, in the description and claims which follow, the layer or layers of semiconductor material disposed between substrate 14 and conductive layer 22 will be generally referred to as the "semiconductor body," and this term is intended to include combinations of semiconductor layers of various conductivities and materials which will provide for a flow of electrical current when appropriately combined with one or more electrodes. This flow of electrical current is specifically defined to include the switching of current accomplished by photodiodes and phototransistors, as well as the generation of and collection of current accomplished by photovoltaic devices such as solar cells. Regardless of its ultimate configuration, it is for the purpose of substantially reducing the rate of flow of current through low resistance current paths between the substrate electrode and the top electrode that the instant invention was developed.

Regardless of exact manner in which the current-shunting defects arise, the defects manifest themselves as short circuit regions wherein low resistance current paths are formed between the second electrode or transparent conductive layer and the substrate electrode of a photovoltaic device. These defects may also be latently manifested by sudden catastrophic failure under operating conditions of the photovoltaic device. The present invention is successful in substantially reducing or eliminating the current shunting effects of both of said patent and latent defects.

Figure 14:
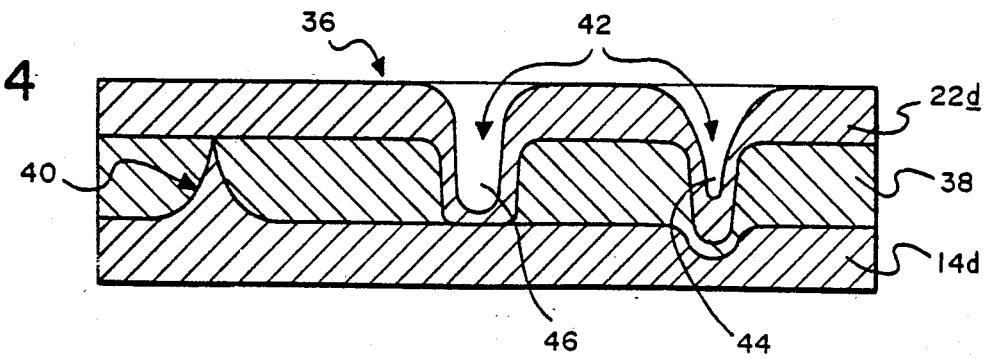
FIG. 14 is a cross sectional view of a portion of a photovoltaic device illustrating various types of defects therein.

The formation and effect of said defects will be better understood by reference to FIG. 14 which illustrates a portion of a photovoltaic device 36 formed of a substrate 14d, an active semiconductor body 38, and a transparent conductive layer 22d. A first defect region is depicted by a raised protuberance or spike 40 associated with and extending from the deposition surface of substrate 14d. Raised protuberance 40 may result from, inter alia, (1) metallurgical irregularities such as impurities, inclusions, columnar growth, etc. in the material from which substrate 14d is formed, (2) mechanical damage due to nicks, abrasion's, etc. occuring during handling of substrate 14d, (3) articles of dust or other particulate matter contaminating the surface of substrate 14d during handling, processing, etc. thereof. Spike 40 is of sufficient height so as to be either incompletely or inadequately covered by the subsequently deposited, layers making up semiconductor body 38. In this manner, a defect region is formed in the immediate vicinity of protuberance 40. Obviously, where such defect regions occur in a semiconductor or photovoltaic device, a low resistance current path between conductive layer 22d and substrate 14d is established since the thickness, if any, of semiconductor body 38 separating the two electrodes is insufficient to prevent current from shunting therebetween.

A second illustrated defect region is formed in the immediate vicinity of a crater, generally 42, which can originate in either (1) substrate 14d, or (2) semiconductor body 38 of photovoltaic device 36. As herein defined, "craters" include depressions in (1) the deposition surface of substrate 14d, or (2) regions of photovoltaic device 36 onto which insufficient semiconductor material is deposited, thereby causing conductive layer 22d and substrate 14d to either (1) electrically approach, or (2) come into direct electrical contact with one another. Causes of such craters 42, which may also be referred to as pin holes or pits, may include (1) metallurgical or chemical impurities and inclusions in the surface substrate 14d, (2) impurities and inclusions in the semiconductor body 38, or (3) nonuniform deposition of the semiconductor layers or defective growth of the semiconductor body. Regardless of how crater 42 originates, deposition of the transparent conductive material (in the preferred embodiment, indium tin oxide) over a portion of the semiconductor body 38 having crater 42 formed therein, results in the electrode material at least partially being deposited thereinto. A low resistance current path is thereby established between substrate 14d and conductive layer 22d through which electrical current is diverted from its normal path of travel through semiconductor body 38 of photovoltaic device 36. In FIG. 14, a crater formed due to a defect in substrate 14d is illustrated by reference numeral 44, while a crater formed due to nonuniform deposition of semiconductor body 38 is illustrated by reference numeral 46.

A third type of defect (not shown) can arise in poor quality regions of the semiconductor body. These regions, which may be of improper morphology, composition or defective growth, exhibit low electrical resistivity relative to the remainder of the semiconductor body, and can thus provide a low-resistance current path between electrodes of the device.

Defects which provoke short circuit current flow generally cause impaired performance of the photovoltaic devices with which they are associated. Under operating conditions, the electrical potential established between conductive layer or second electrode and the substrate or first electrode will be decreased if such low resistance short circuit paths are present for the flow of electrical current generated by the device. Furthermore, if the short circuit current paths are either (1) of sufficient magnitude, or (2) of sufficient number, they can shunt a sufficient amount of current to render the entire photovoltaic device inoperative.

Referring now to the previously mentioned "operational mode failures," said failures are manifested by a sudden catastrophic inability of the photovoltaic device to function under normal operating conditions even though the device has actively generated current for some period of time. Applicants believe operational mode failures result from a current or voltage driven reaction which exacerbates or intensifies latent defects existing in the photovoltaic device. Extremely high current densities are readily attained across defect sites having low resistivities. For example, a one micron square defect having a potential of one volt imposed thereacross could reach a current density of 100 Amperes/cm which would destroy the device. Further, it is possible that under the influence of the electrical field developed between conductive layer 22d and substrate 14d when photovoltaic device 36 is operatively employed to produce electrical energy from incident light energy, electrode material may migrate across a defect site such as crater 42 or protuberance 40. Since the defect site is incompletely filled or covered upon deposition of the semiconductor material, even very slight migration may be sufficient, over a period of time, to establish a low resistivity current path through that defect site, effectively short circuiting the device. Once such a low resistance current path is established, under low intensity illumination, large amounts of current can readily flow therethrough and damage the overall operation of the photovoltaic device. Another possible explanation for operational mode failure might involve Joule heating and the resultant degradation of the semiconductor material proximate a defect region as current flows through that defect region.

Regardless of their cause and/or nature, the present invention substantially prevents the free flow of electrical current through these defect regions from the electrode grid.

Figure 3:
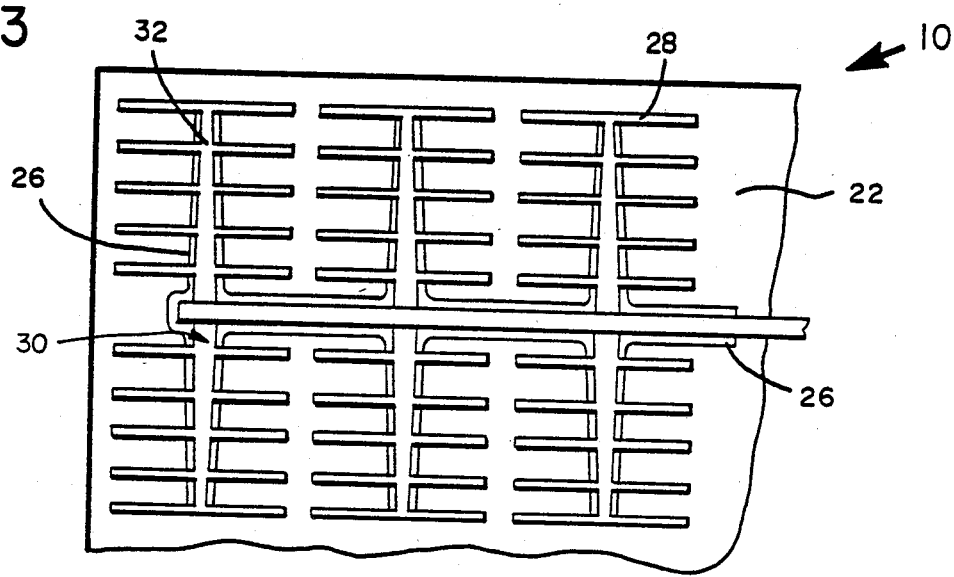
FIG. 3 is a top plan view of the photovoltaic device of FIG. 1.

Referring now to FIG. 3, a top plan view of a portion of photovoltaic device 10 is shown. Insulating layer 26 electrically insulates busbar structure 30 from conductive layer 22. Grid fingers 28, however, remain in electrical contact with conductive layer 22. As shown in FIG. 3, insulating layer 26 is substantially coextensive with minor bus 32 and major bus 34, the width of insulating layer being slightly greater than the width of minor bus 32 and major bus 34. Since this is the case, insulating layer 26 is preferable transparent, so that the area photovoltaic device 10 which may be exposed to light is not reduced.

The composition of insulating layer 26 may be chosen from a wide variety of materials. Any material which provides the desired electrical insulating effect and which does not deleteriously affect conductive layer 22, bus grid structure 24, or the remainder of the photovoltaic device can be utilized. Suitable insulating materials include, by way of example only and not as a limitation upon the present invention, ink having a suitably high resistance, any of the commonly known insulators such as insulating carbides, natural and synthetic polymers (for example, acrylics, fluorocarbon polymers and silicones), ceramic materials, glasses and insulating oxides.

The insulating layer may be applied by any method that is suitable for applying the chosen insulating material. For example, such methods include silk screening, roller coating, spraying, vapor deposition, and evaporation, for example. The method should not deleteriously affect the remainder of the photovoltaic device.

Figure 4:
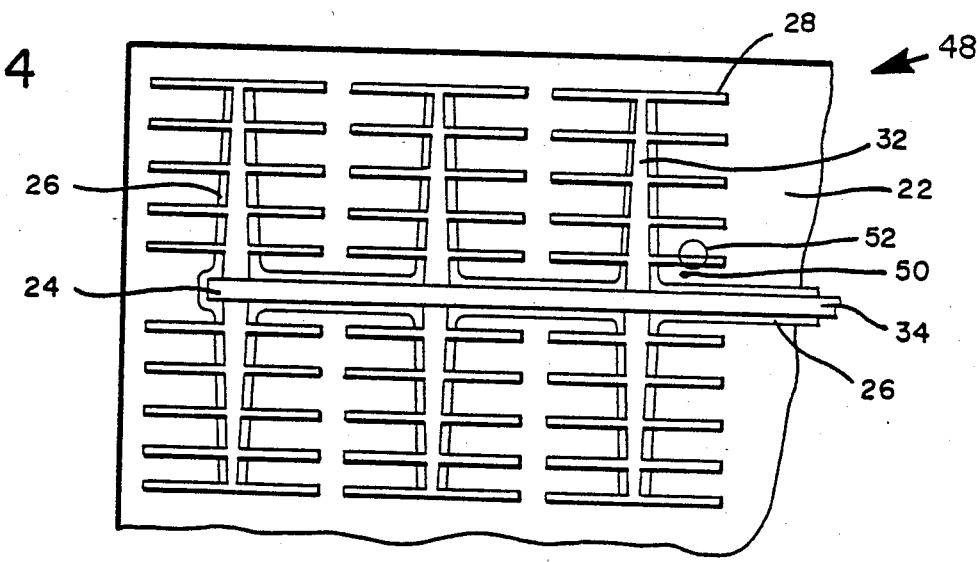
FIG. 4 is a top plan view of a portion of a photovoltaic device similar to the photovoltaic device of FIG. 3, but having a defect therein.

The effect of providing a layer of insulating material between the current carrying portion of the electrode grid and the semi-conductor body is illustrated in FIG. 4, where a photovoltaic device 48 is illustrated which is similar to photovoltaic device 10 of FIG. 1. However, photovoltaic device 48 includes a shunt or low resistance current path in the semiconductor body portion of photovoltaic device 48. This shunt or low resistance current path is referred to by reference numeral 50. The area that is significantly affected by low resistance current path 50 at the surface of conductive layer 22 is indicated by line 52. The area enclosed by line 52 includes the area where part of one of grid fingers 28, minor busbar 32 and major busbar 34 lies. However, low resistance current path 50 has no effect upon either minor busbar 32 or major busbar 34 since they are insulated from conductive layer 22 with layer of insulating material 26. Thus, no current in minor busbar 32 or major busbar 34 can be sinked directly therefrom to low resistance current path 50. However, some current can be sinked through the particular grid finger 28 that lies in the area defined by line 52.

Figure 5:
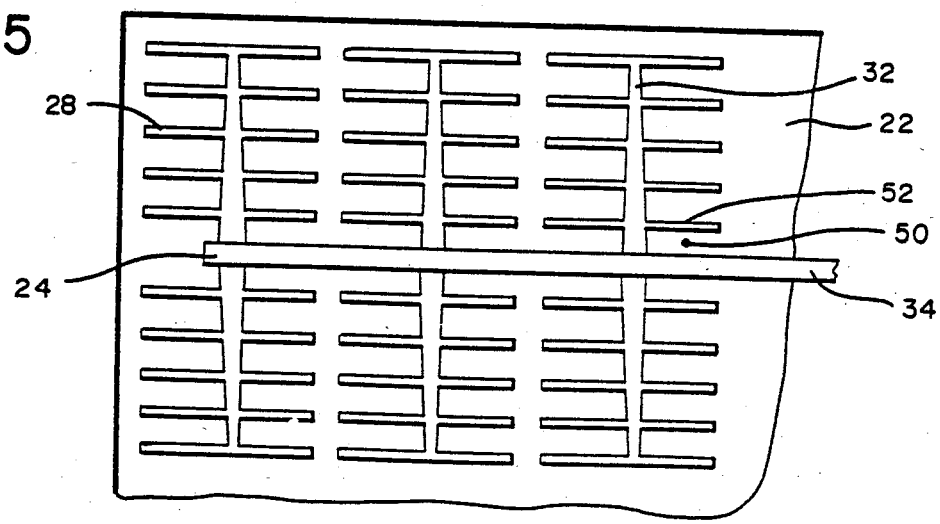
FIG. 5 is a top plan view of a photovoltaic device not in accordance with the present invention but having a similar type of defect as illustrated in FIG. 4.

Since the grid fingers are of relatively small cross-sectional area, the amount of current which can be sinked to low resistance current path 50 is relatively small compared to the amount of current which could pass through either minor busbar 32 or major busbar 34 if layer of insulating material 26 was not present. This situation is illustrated in FIG. 5 wherein a photovoltaic device 54 is depicted that is identical in design to photovoltaic device 48 except that there is no layer of insulating material between electrode grid or bus grid structure 24 and the semi-conductor body of photovoltaic device 54. Accordingly, low resistance current path 50 in FIG. 5 causes a short through not only one of grid fingers 28, but also through major busbar 34 and the minor busbar 32 that lies in the area encompassed by line 52. The effect of low resistance current path 50 on photovoltaic device 54 is many times greater than the effect of low resistance current path 50 on photovoltaic device 48 made in accordance with the invention.

Figure 6:
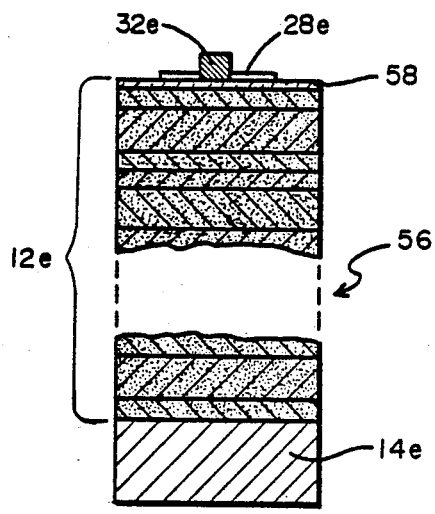
FIG. 6 is a fragmentary, cross-sectional view of a tandem or cascade photovoltaic device comprising a plurality of p-i-n-type cells, each layer of cells formed from an amorphous, semiconductor alloy, the photovoltaic device having a conductive layer in accordance with one embodiment of the present invention.

Referring to FIG. 6, there is illustrated another embodiment of a photovoltaic device 56 in accordance with the present invention. Photovoltaic device 56 is similar to photovoltaic device 10 illustrated in FIG. 1, including a substrate 14e, grid fingers 28e, a minor busbar 32e and a transparent conductive layer 58, with several exceptions. First, photovoltaic device 56 does not have an insulating layer 26. However, an insulating layer can optionally be included. Second, conductive layer 58 of photovoltaic device 56 has a relatively high resistance therethrough for reducing the current sinking effect caused by a low resistance current path or shunt in semiconductor body 12e. The relatively high sheet resistance of conductive layer 58 will usually be at least about 300 ohms/square, and preferably about 1,000 ohms/square. Usually, the typical sheet resistance of a conductive layer in a photovoltaic device of this type, such as photovoltaic device 10 of FIG. 1, would be in the range of from about 50 to about 100 ohms/square.

Figure 7:
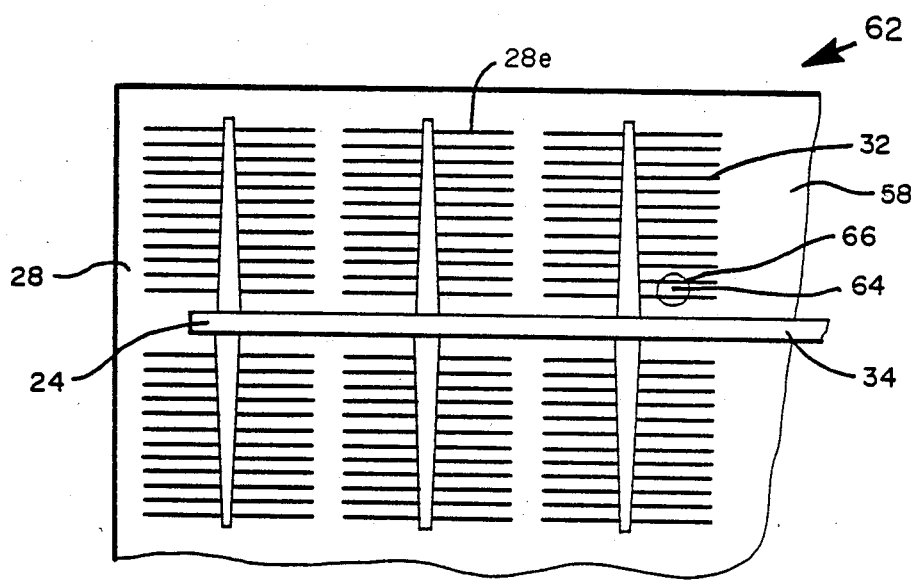
FIG. 7 is a top plan view of a portion of a photovoltaic device similar to the photovoltaic device shown in FIG. 6 but having a short therein.
Figure 8:
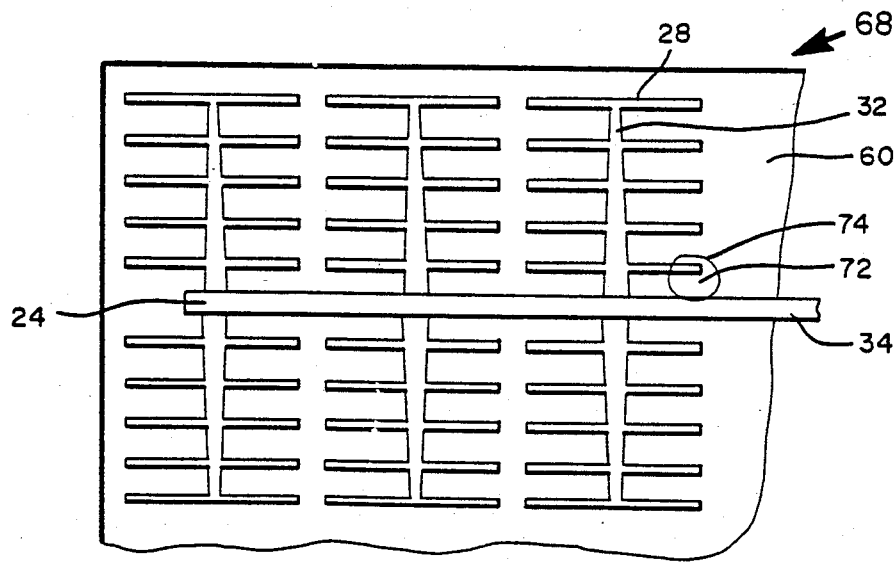
FIG. 8 is a top plan view of a portion of a photovoltaic device not in accordance with the present invention.

The effect of providing such a relatively high resistance conductive layer 58 is illustrated in FIG. 7 compared to a relatively low resistance conductive layer 60, illustrated in FIG. 8. In FIG. 7, a photovoltaic device 62 is of similar design to photovoltaic device 56 of FIG. 6, having a conductive layer 22 that has a resistance of at least about 300 ohms/square. The grid fingers 28e of photovoltaic device 62 have been designed for use in conjunction with high resistance conductive layer 58. Grid fingers 28e are substantially smaller in cross-sectional area than, for example, grid fingers 28 of photovoltaic device 68 of FIG. 8. The maximum amount of current that can be carried by each of grid fingers 28e is much less than the maximum amount of current that can be carried by grid fingers 28. Thus, when one of grid fingers 28e is in the area affected by a low resistance current path, much less current can be sinked through that grid finger. A shunt or low resistance current path 64 is present in semiconductor body 12 of photovoltaic device 62. Low resistance current path 64 significantly affects the area at the surface of conductive layer 58 referred to by reference numeral 66. Since the resistance of conductive layer 58 is relatively high, the effect of low resistance current path 64 in semiconductor body 12 at the surface of conductive layer 58 is greatly reduced from the effect that would occur if conductive layer 58 had a relatively low sheet resistance. Such a situation is illustrated in FIG. 8 wherein a photovoltaic device 68 is illustrated, similar in construction to photovoltaic device 62 except that the conductive layer of photovoltaic device 68, referred to by reference numeral 70 has a typical resistivity for a conductive layer, that is, in the range of from about 50 ohms/square to about 100 ohms/square.

A shunt or low current path 72 is present in semi-conductor body 12 of photovoltaic device 68 and is identical to low resistance current path 64 of photovoltaic device 62. Because of a relatively low resistance conductive layer 60, the grid fingers can be spaced further apart, requiring larger fingers, than in photovoltaic device 62, which utilizes more fingers but of smaller size. Low resistance current path 72 significantly affects a much larger area on the surface of conductive layer 60, as illustrated by line 74. Whereas, the area 66 in FIG. 7 was sufficient to affect only one very small grid finger 28e, in FIG. 8 the affected area on the surface of conductive layer 60 is much larger and encompasses a portion of one of grid finger 28, which is relatively large, together with major busbar 34, allowing current from that grid finger 28 and major busbar 34 to sink current through low resistance current path 72 thereby seriously diminishing the performance of photovoltaic device 68.

The second electrode or transparent conductive layer may comprise any material having the desired properties, namely transparency, the desired resistance and otherwise being compatible with the device. Suitable materials include, for example, various conductive metal oxide coatings such as tin oxide materials, including $SnO_2$ and $SnO_2$ doped with antimony or other elements; $In_2O_3$ and $In_2O_3$ doped with tin or other elements; or cadmium-oxygen materials such as CdO and cadmium oxide doped with tin. Note however, such materials as $In_2O_3$, $SnO_2$, and ZnO are regarded as electrical insulators unless combined with a dopant, and formed in a manner which develops a large number of oxygen vacancies. While tin is commonly used to dope indium oxide, other metals, such as cadmium, bismuth, and molybdenum may also be employed. Similarly, while antimony is commonly used to dope tin dioxide, metals such as cadmium, molybdenum, and indium may also be employed.

The above materials, with tin as a dopant for the indium oxide and antimony as a dopant for the tin dioxide, have indices of refraction which minimize reflection, and are particularly well suited for use as thin, electrically conductive, light transmissive films on semiconductor materials. This is especially true when they are deposited in about 550 angstrom thicknesses, which optimizes their "optical thickness", to minimize reflection from their surfaces.

Other materials which may be used for the conductive layer include an ultra thin film of a metal such as aluminum and noble metals.

Any of many methods of depositing the conductive layer may be employed which are known to those skilled in the art. Such methods include, for example, dc or rf sputtering, which may be reactive or nonreactive, and evaporation (one evaporation process being disclosed in U.S. Pat. No. 4,336,277 which is hereby incorporated by reference).

One particularly useful evaporation process is disclosed in U.S. patent application Ser. No. 481,619 filed Apr. 4, 1983, of Prem Nath, which is hereby incorporated by reference. Briefly, that process includes the steps of: vacuumizing a chamber, continuously advancing a substrate through the chamber; providing a replenishable source of metallic material; evaporating the metallic material in the chamber thereby producing a metallic vapor in a zone defined between the substrate and the source of metallic material; introducing oxygen gas into the zone; replenishing the metallic material as it is evaporated from the source; and introducing electromagnetic energy into the zone to develop an ionized plasma from the oxygen and metallic atoms, whereby a metal oxide film is continuously deposited onto the advancing substrate.

The electromagnetic energy is provided by an r.f. power supply adapted to generate an r.f. signal of preferably, about 13.56 megahertz; the pressure of the oxygen gas introduced into the vapor zone is preferably about $10^{-2}$ to $10^{-4}$ torr. The substrate may be (1) stainless steel, aluminum or like conductive metal; (2) glass; or (3) a synthetic plastic resin.

The metallic material which is evaporated may include (1) indium, with the method including the additional step of heating the substrate to a temperature of about 150°–300° C.; or (3) zinc, with the substrate being maintained at about room temperature during the deposition of the film.

As is known to those skilled in the art, the resistance of the conductive layer can be fixed as desired by controlling the thickness of the conductive layer or by controlling the composition thereof.

Figure 9:
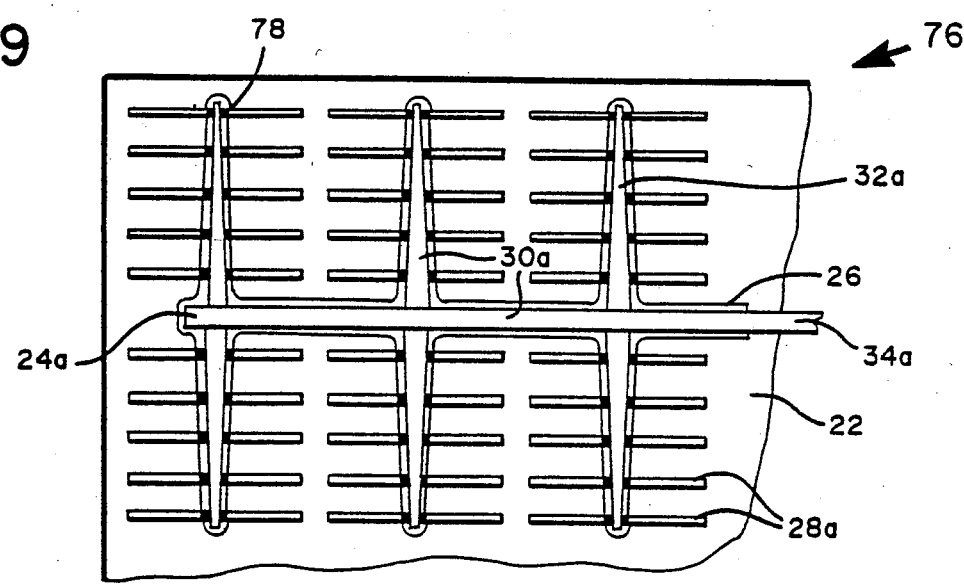
FIG. 9 is a top plan view of a portion of a photovoltaic device that includes a bus grid structure in accordance with one embodiment of the present invention.

There is illustrated in FIG. 9 another embodiment of a photovoltaic device in accordance with the present invention. Photovoltaic device 76 of FIG. 9 is similar in construction to photovoltaic device 10 of FIG. 1 but with a modification of its electrode grid or bus grid structure. Bus grid structure 24a includes a current collecting portion, consisting of grid fingers 28a and a current carrying portion, consisting of busbar structure 30a that includes minor busbar 32a and a major busbar 34a. As in FIGS. 1 and 2, since busbar structure 30a is insulated from transparent conductive layer 22, no current can be collected by busbar structure 30a. Thus, if a short or low resistance current path is proximate busbar structure 30a no current can be sinked to the short through busbar structure 30a, thereby reducing the degrading effect on the electrical performance of photovoltaic device 76 should such a short be present or should one develop. Bus grid structure 24a differs from bus grid structure 24 in that each of grid fingers 28a is resistively connected to minor busbar 32a so that the current carrying capability between busbar structure 30a and grid fingers 28a is, for each of grid fingers 28a, about five times or less than the amount of current which can be produced by the area of photovoltaic device 76 for which that particular grid finger 28a collects current.

Grid fingers 28a may be resistively connected to minor busbar 32a in any suitable manner, as long as the desired resistance is obtained. As illustrated in FIG. 9, each of grid fingers 28a is resistively connected to one of the minor busbars 32a with a resistive connection 78. Each of resistive connections 78 comprises a dot of material that has a desired resistance which connects the end of a grid finger 28a with one of minor busbars 32a.

Figure 10:
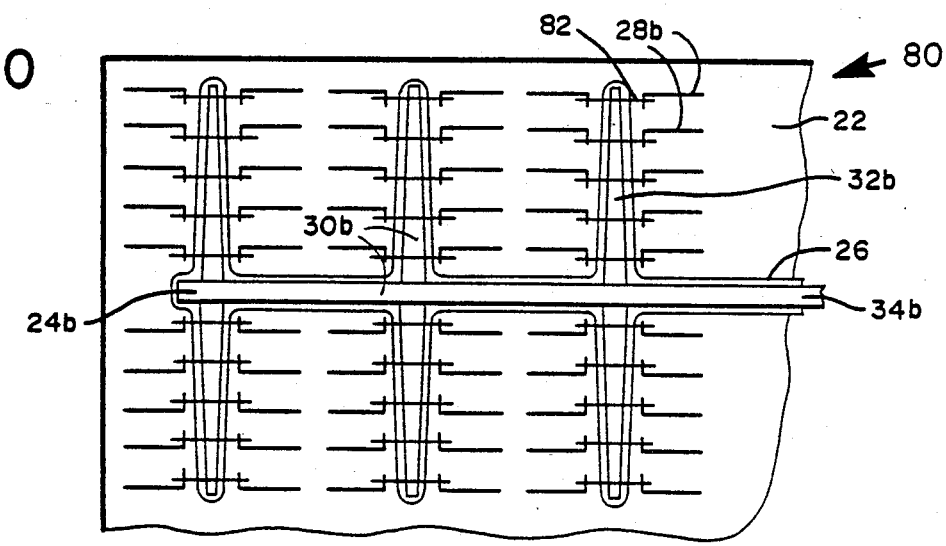
FIG. 10 is a top plan view of a portion of a photovoltaic device that includes a bus grid structure in accordance with another embodiment of the present invention.

Illustrated in FIG. 10 is another embodiment of a photovoltaic device in accordance with the present invention in which each of grid fingers 28b is resistively connected to busbar structure 30b so that the current carrying capability between busbar structure 30b and grid fingers 28b is, for each grid finger 28b, about five times or less than the amount of current which can be produced by the area of photovoltaic device 80 for which that particular grid finger 28b collects current. Each of resistive connections 82 comprise a line of resistive ink that is in contact with one of minor busbars 32b and allows connection thereto with one or more of grid fingers 28b. Such resistive connections 82 and grid fingers 28b can be conveniently formed by screen printing, for example.

Any suitable method of forming a bus grid structure including portions thereof can be used in accordance with the invention. Other suitable methods include, for example, electroplating and vacuum deposition (for example, sputtering). The entire grid may be formed by one method or by a combination of several methods. In accordance with one embodiment, resistive connections 82 are formed by screen printing with a mixture of silver ink and carbon ink in desired proportions to achieve the desired resistance, for example, such as about 70 micro ohms/square.

Figure 11:
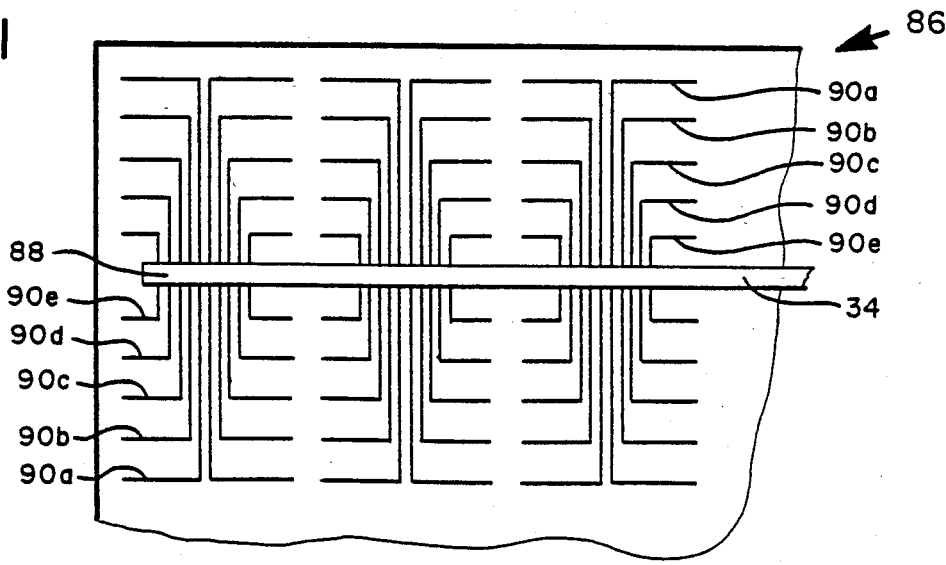
FIG. 11 is a top plan view of a portion of a photovoltaic device that includes a buffered bus grid structure in accordance with one embodiment of the present invention.

Referring to FIG. 11, there is illustrated an alternate embodiment of a photovoltaic device in accordance with the present invention. Photovoltaic device 86 of FIG. 11 is similar to photovoltaic device 10, except that photovoltaic device 86 has no insulating layer 26 and includes a buffered electrode grid or buffered bus grid structure 88. Buffered bus structure 88 includes a major busbar 34 and a plurality of buffered grid fingers 90a–90e. Each of grid fingers 90a–90e are unbranched and are directly coupled to major busbar 34.

Figure 12:
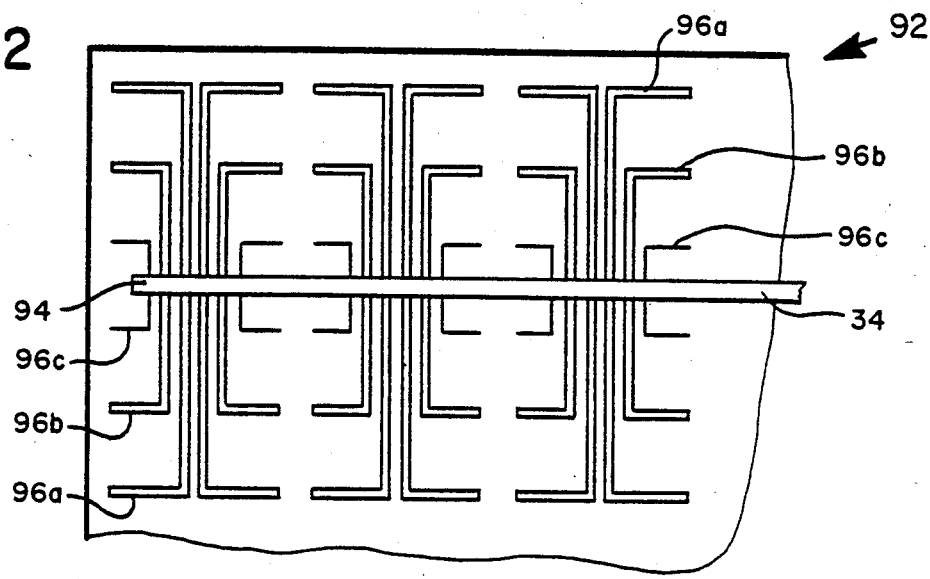
FIG. 12 is a top plan view of a portion of a photovoltaic device that includes another embodiment of a buffered bus grid structure in accordance with the present invention.

Referring to FIG. 12, there is illustrated an alternate embodiment buffered electrode grid in accordance with the present invention. Photovoltaic device 92 of FIG. 12 is similar in design to photovoltaic device 10 of FIGS. 1 and 2 with the exceptions that photovoltaic device 92 does not have an insulating layer 26 and photovoltaic device 92 has a buffered electrode grid or buffered bus grid structure 94. Buffered bus grid structure 94 includes a major busbar 34 and a plurality of buffered grid fingers 96a–96c. Each buffered grid finger 96a–96c is of a cross-sectional area so that each buffered grid finger 96a–96c has the same length to length resistance. Conveniently, this can be done by making the longer grid fingers (96a) wider and/or thicker than intermediate grid fingers 96b which are in turn wider and/or thicker than the shortest buffered grid fingers 96c. If desired, major busbar 34 could be insulated from the semiconductor body.

Figure 13:
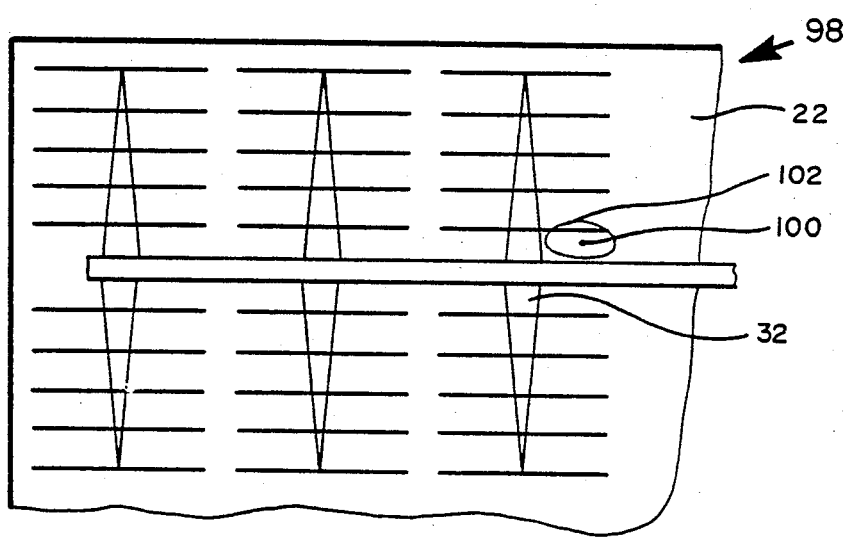
FIG. 13 is a top plan view of a portion of a bus grid pattern not in accordance with the present invention.

Referring to FIG. 13, there is illustrated a prior art photovoltaic device 98 having a shunt or low resistance current path 100. Photovoltaic device 98 has a substrate, a semi-conductor body and a conductive oxide layer similar to that of photovoltaic device 10. The area at the surface of conductive oxide layer 22 of photovoltaic device 98 which is affected by low resistance current path 100 is illustrated as area 102. Since area 102 encompasses a portion of minor bus 32, a relatively large amount of current can be sinked from minor bus 32 to shunt 100.

Figure 15:
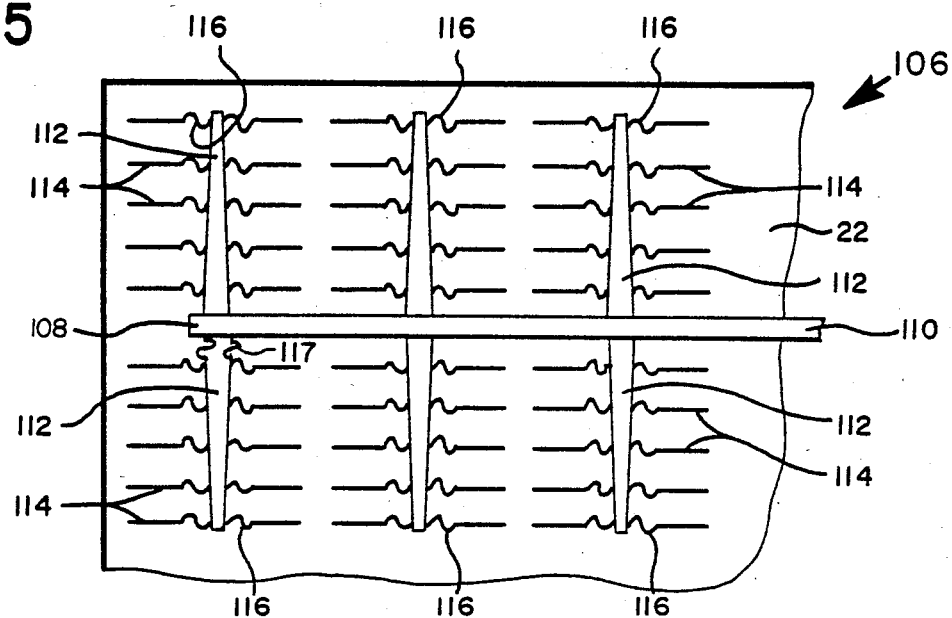
FIG. 15 is a top plan view of a portion of a photovoltaic device that includes another embodiment of a bus grid structure in accordance with the present invention.
Figure 16:
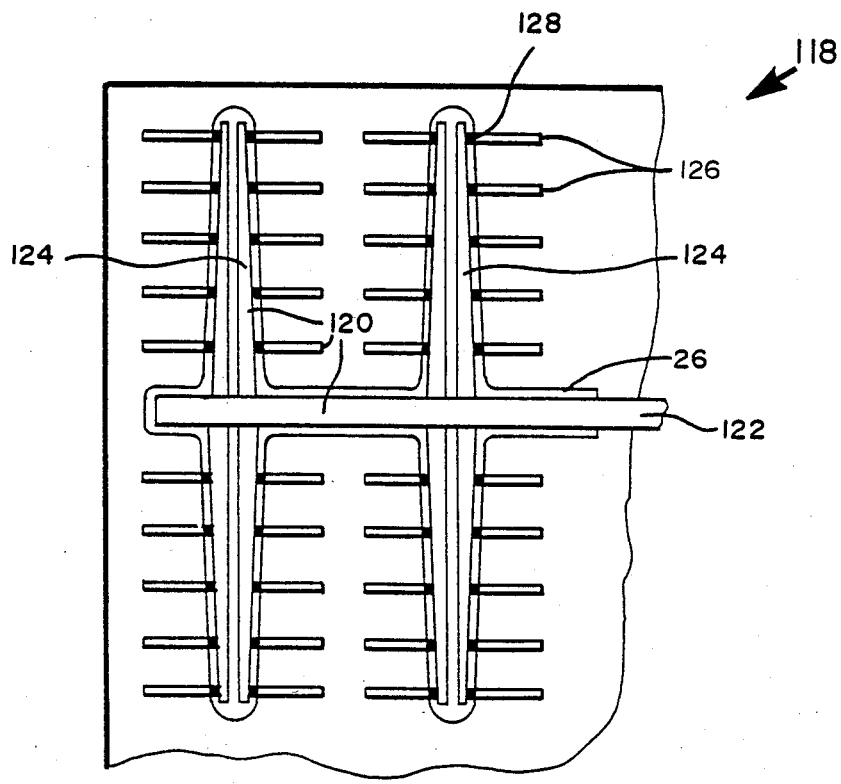
FIG. 16 is a top plan view of a portion of a photovoltaic device that includes another embodiment of a bus grid structure in accordance with the present invention.

Another embodiment of the present invention is illustrated in FIG. 15. Photovoltaic device 106 is similar in design to photovoltaic device 10 with the exception of the electrode grid or bus grid structure. As illustrated in FIG. 16, a bus grid structure 108 is provided that includes a major busbar 110, a minor busbar 112, and a plurality of grid fingers for collecting current produced by photovoltaic device 106. Each of grid fingers 114 is electrically connected to a minor busbar 112 with a destructible connection 116. Each destructible connection 116 acts as a fuse and is such that when the current through destructible connection 116 reaches a predetermined amount, that destructible connection 116 terminates. The predetermined amount of current can be as desired, but usually, for each grid finger, the predetermined amount will be slightly greater (for example, about 1.2 times) the maximum amount of current which can be produced by the area of photovoltaic device 106 for which that particular grid finger 114 collects current. Generally, the predetermined amount will not be less than the amount of current which can be produced by the area of the photovoltaic device 106 for which that particular grid finger 114 collects current.

Destructible connection 116 can be of any type which terminates the electrical connection between grid finger 114 and minor busbar 112 when the current being carried between grid finger 114 and minor busbar 112 reaches the predetermined amount. Generally, destructible connection 116 will comprise fusible material. The fusible material may be fusible metal, such as, for example, tin, lead, bismuth, and alloys thereof. The thickness and cross-sectional area of the fusible material which makes up destructible connection 116 can be adjusted as desired to provide the desired protection. When the current between a grid finger 114 and minor busbar 112 reaches the predetermined amount, the fusible material becomes molten and agglomerates thereby terminating the connection between grid finger 114 and minor busbar 112. As will be appreciated by those skilled in the art, destructible connection 116 can be made by any of a variety of methods, such as vapor deposition, electroplating, or any other suitable method.

In accordance with a related embodiment, also illustrated in FIG. 15, a destructible connection 117 is provided between minor busbar 112 and major busbar 110. The purpose of destructible connection 117 is the same as for destructible connection 116, to disconnect if the current reaches a predetermined amount. Usually, destructible connection 117 will be able to conduct slightly more (about 1.2 times, for example) current than maximum amount produced by the area of the device for which the minor busbar carries current. Destructible connection 117 is made of the same type of material that can be used for destructable connection 116. Destructible connection or an equivalent type thereof can be used regardless of the grid finger connection. Destructible connection 117 can be used wherever a minor busbar is connected to a major busbar, as in, for example, FIGS. 2–5 and 7–10.

In FIG. 16, there is illustrated a top plan view of a portion of a photovoltaic device 118 in accordance with the invention that includes another embodiment of a bus grid structure 120. Photovoltaic device 118 is similar in design to photovoltaic device 10 except that bus grid structure 120 is different than the bus grid structure of photovoltaic device 10. Bus grid structure 120 includes a major busbar 122, a plurality of bifurcated minor busbars 124 and a plurality of grid fingers 126. Each of grid fingers 126 is connected to its respective bifurcated minor busbar 124 with a resistive connection 128. Each of resistive connections 128 comprises material that has a desired resistance when connected between a grid finger 126 and a bifurcated minor busbar 124. Each of bifurcated minor busbars 124 is similar to minor busbar 32 except that bifurcated minor busbar 124 is split lengthwise into essentially equal widths. This has the effect of minimizing the amount of current that can be sent to a low resistance current path defect in the semiconductor body via a minor busbar.

Figure 17:
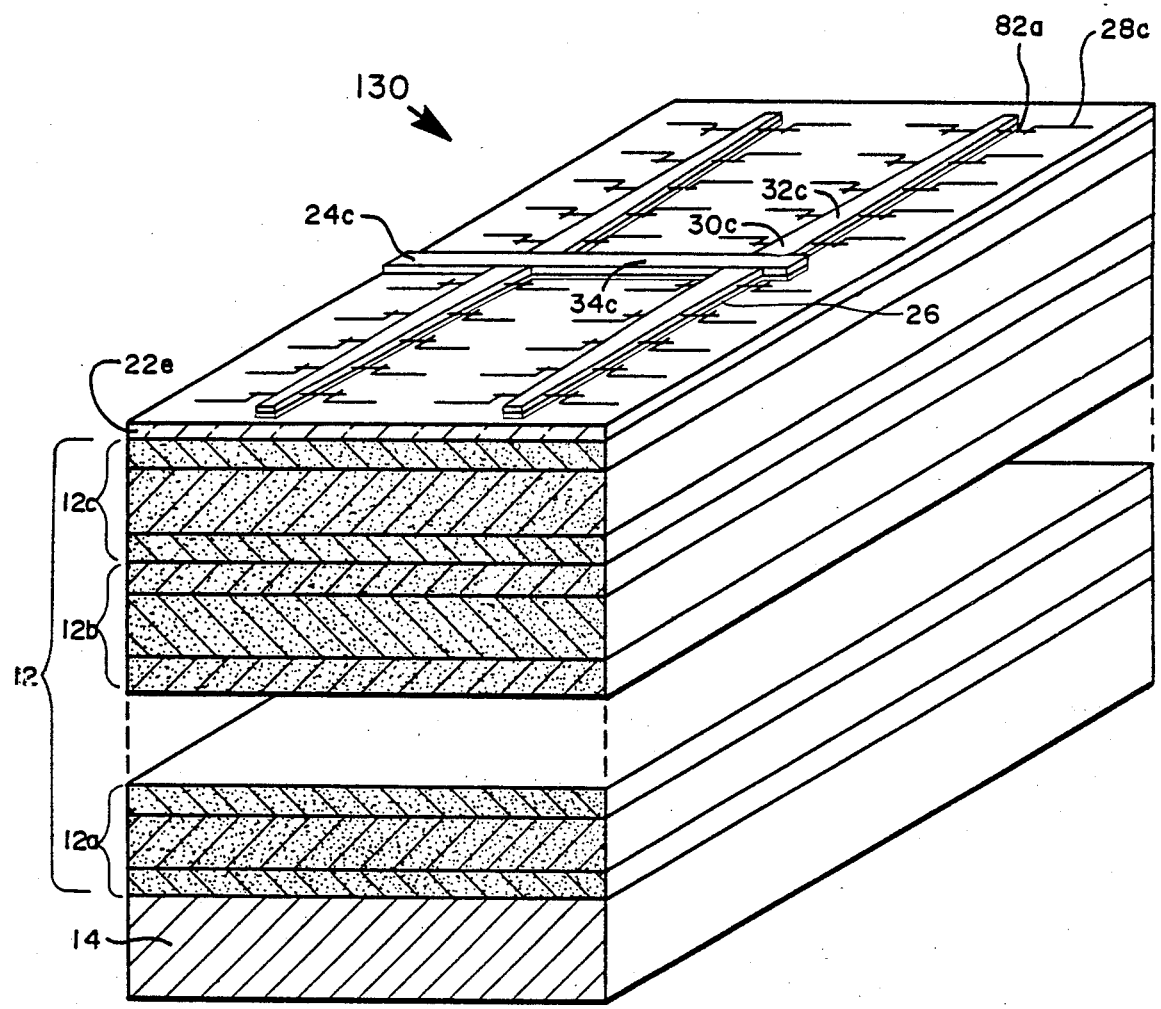
FIG. 17 is a cross-sectional, perspective view of a photovoltaic device in accordance with the present invention.

Referring to FIG. 17, there is illustrated a photovoltaic device 130 in accordance with the present invention that incorporates several of the features previously described. Photovoltaic device 130 includes a semiconductor body 12 consisting of a plurality of p-i-n photovoltaic cells 12a, 12b, and 12c. Below lowermost cell 12a is a substrate 14. Over the surface of semiconductor body 12 is a transparent, conductive layer 22e over which lies an electrode grid or bus grid structure 24c which comprises a busbar structure 30c that includes a minor busbar 32c and a major busbar 34c. Connected to each of minor busbars 32c are a plurality of grid fingers 28c that are utilized to collect current produced by photovoltaic device 130. Each of grid fingers 28c are similar to grid fingers 28b previously described with respect to FIG. 10. Each of grid fingers 28c are resistively connected to a particular minor busbar 32c by means of a resistive connection 82a that is similar to resistive connection 82 described with respect to FIG. 10. As described with respect to FIGS. 1 and 2, between conductive layer 22 and portions of bus grid structure 24c is a layer of insulating material 26. The current carrying portion of bus grid structure 24c, busbar structure 30, is insulated from semiconductor body 12 so that no current can be sinked directly to a short or low resistance current path through busbar structure 30c.

Transparent conductive layer 22e has a relatively high resistance of at least about 300 ohms/square. This further reduces the degrading effect on the electrical performance of photovoltaic device 130 should any shorts be present or should any develop.

Figure 18:
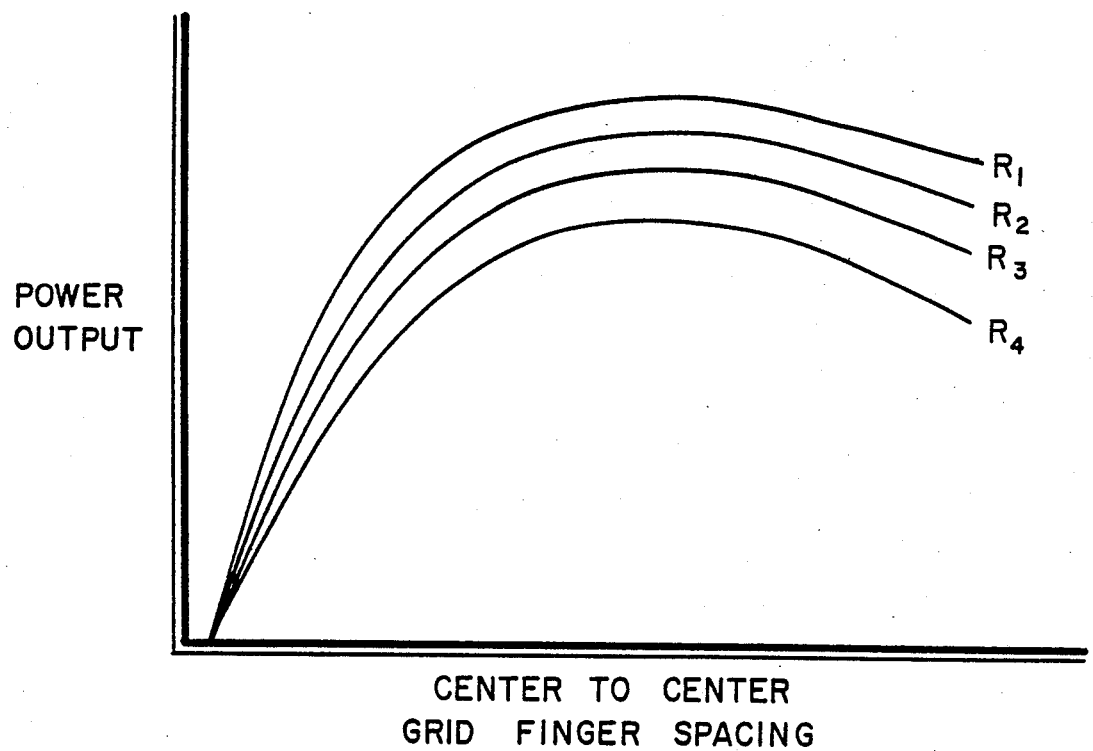
FIG. 18 is a diagrammatic illustration of the relationship of power output of photovoltaic devices versus center-to-center grid finger spacing for different conductive layer resistances and constant grid finger width.
Figure 19:
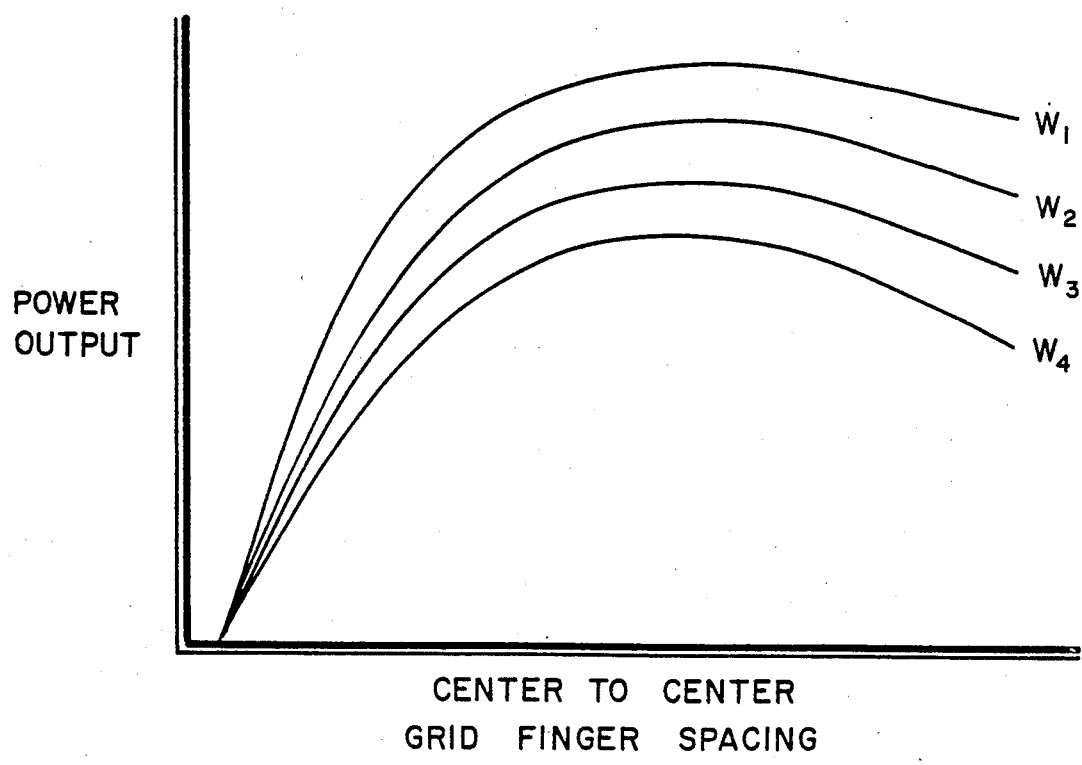
FIG. 19 is a diagrammatic illustration of the relationship of power output of photovoltaic devices versus center-to-center grid finger spacing for different grid finger widths at a constant conductive layer resistance.

Referring to FIGS. 18 and 19, there are illustrated several graphs relating power output of photovoltaic devices to variables, including center-to-center grid finger spacing, grid finger width, and transparent conductive layer resistance. Such graphs are useful in optimizing the design of a photovoltaic device while designing the device to provide a desired degree of protection from defects (low resistance current paths) in the device.

More specifically, FIG. 18 is a graph that shows the relationship of photovoltaic device power output versus center-to-center grid finger spacing for different transparent conductive layer resistances and constant grid finger width. While the graph of FIG. 18 illustrates that the lowest resistance conductive layer provides the greatest power output, such an arrangement also provides the least degree of protection from defects. Once the desired conductive layer resistance is set, taking into account the protection provided by a higher resistance conductive layer, the grid finger spacing can be chosen. For a particular conductive layer resistance, there is an optimum center-to-center grid finger spacing which can easily be determined by reference to a graph as in FIG. 18. As higher resistance conductive layers are utilized, proper center-to-center grid finger spacing becomes more critical, since the range of relatively practical center-to-center grid finger spacing becomes relatively narrow.

FIG. 19 graphically illustrates the relationship of power output of a photovoltaic device versus center-to-center grid finger widths at constant conductive layer resistance. From this graph, it is apparent that the smallest grid finger width is optimum. However, the optimum center-to-center grid finger spacing depends on the grid finger width. To a point, greater grid finger spacing provides increased power output since shadowing of the device is reduced. After an optimum point is reached, output decreases for greater grid finger spacing.

A photovoltaic device in accordance with the invention is preferably encapsulated in a transparent, protective, electrically insulating material. Suitable encapsulation techniques and materials are disclosed in U.S. Pat. No. 4,419,530, which is hereby incorporated by reference. Also, if desired, a back reflector layer can be incorporated into the device, such as disclosed in U.S. patent application Ser. No. 359,371 of V. Cannella, D. Allred and R. Mohr, filed Mar. 18, 1982 and entitled "Improved Back Reflector System and Devices Utilizing Same," for example.

While the invention has been described with respect to preferred embodiments, it is to be understood that numerous changes, modifications and substitutions may be made and are intended to be covered by the appended claims.

We claim:

1. A photovoltaic device comprising:
   an electrically conductive substrate layer;
   a semiconductor body deposited upon said substrate layer;
   a transparent conductive layer over at least a portion of said semiconductor body for facilitating collection of electrical current produced by the photovoltaic device; and
   a bus-grid structure, in contact with said conductive layer, said bus-grid structure comprising a current collecting portion comprising grid fingers and a current carrying portion comprising a busbar structure for carrying current collected by said current collecting portion, the entirety of said current carrying portion which overlies the semiconductor body being electrically insulated from said semiconductor body by a layer of solid material.

2. A photovoltaic device as recited in claim 1 wherein said semiconductor body comprises amorphous semiconductor material.

3. A photovoltaic device as recited in claim 1 where said semiconductor body includes at least one triad of layers, said at least one triad of layers comprising a p-conductivity layer, an intrinsic layer, and an n-conductivity layer.

4. A photovoltaic device as recited in claim 3 wherein said at least one triad of layers comprises amorphous semiconductor material.

5. A photovoltaic device as recited in claim 1 wherein the device is approximately one hundred square centimeters or more in area.

6. A photovoltaic device as recited in claim 1 wherein said busbar structure is electrically insulated from said semiconductor body by providing a layer of insulating material between said busbar structure and said semiconductor body.

7. A photovoltaic device as recited in claim 6 wherein said insulating layer comprises material selected from the group consisting of natural and synthetic polymer material, insulating oxides, insulating organic material, and insulating carbides.

8. A photovoltaic device as recited in claim 6 wherein the insulating layer is substantially transparent.

9. A photovoltaic device as recited in claim 1 wherein said transparent conductive layer is substantially continuous.

10. A photovoltaic device as recited in claim 1 wherein said transparent conductive layer is discontinuous.

11. The photovoltaic device as recited in claim 1 further comprising a back reflector layer.

12. A photovoltaic device as recited in claim 1 wherein said bus grid structure comprises an array of buffered grid fingers.

13. A photovoltaic device as recited in claim 1 wherein said bus grid structure comprises silver.

14. A photovoltaic device as recited in claim 1 wherein said conductive layer has a sheet resistance of at least about 300 ohms/square.

15. A photovoltaic device as recited in claim 14 wherein said conductive layer has a sheet resistance of about 1,000 ohms/square.

16. A photovoltaic device as recited in claim 1 wherein said bus grid structure comprises a plurality of grid fingers for collecting current and a busbar structure for carrying current collected by said grid fingers, each of said grid fingers being electrically resistively connected to said busbar structure to reduce the current carrying capability between each of said grid fingers and said busbar structure so that the amount of current which can be carried between any of said grid fingers and said busbar structure is limited, for each grid finger, to about five times or less than the maximum amount of current which can be produced by the area of the solar cell from which that particular grid finger collects current.

17. A photovoltaic device as recited in claim 16 wherein said resistive connection comprises ink having a desired resistivity.

18. A photovoltaic device as recited in claim 1 wherein at least a portion of said bus grid structure is formed by screen printing.

19. A photovoltaic device as recited in claim 1 wherein at least a portion of said bus grid structure is formed by electroplating.

20. A photovoltaic device is recited in claim 1 where at least a portion of said bus grid structure is formed by vacuum deposition.

21. A photovoltaic device as recited in claim 1 wherein said bus grid structure comprises grid fingers arrayed in a buffered pattern and a busbar structure, said grid fingers being electrically connected to said busbar structure.

22. A photovoltaic device as recited in claim 21 where of said grid fingers are of about the same length to length resistance.

23. A photovoltaic device comprising:
an electrically conductive substrate layer;
a semiconductor body over said substrate layer;
a transparent conductive layer over at least a portion of said semiconductor body, said conductive layer having a relatively high sheet resistance for reducing the current sinking effect caused by a low resistance current path in the photovoltaic device, said resistance being at least about 300 ohms/square; and,
a bus-grid structure, in contact with said conductive layer, said bus-grid structure comprising a current collection portion comprising grid fingers and a current carrying portion comprising a busbar structure for carrying current collected by said current collecting portion, the entirety of said current carrying portion which overlies the semiconductor body being electrically insulated from said semiconductor body.

24. A photovoltaic device as recited in claim 23 wherein said transparent conductive layer comprises oxide material.

25. A photovoltaic device as recited in claim 24 wherein said oxide material is selected from the group consisting of indium oxide, zinc oxide, and tin oxide.

26. A photovoltaic device as recited in claim 23 wherein said transparent conductive layer comprises material selected from the group consisting of aluminum and noble metals.

27. A photovoltaic device as recited in claim 23 wherein said semiconductor body includes at least one triad of layers, said at least one triad of layers comprising a p-conductivity layer, an intrinsic layer, and an n-conductivity layer.

28. A photovoltaic device as recited in claim 27 wherein said at least one triad of layers comprise amorphous semiconductor material.

29. A photovoltaic device as recited in claim 23 wherein the solar cell is approximately one hundred square centimeters or more in area.

30. A photovoltaic device as recited in claim 29 wherein said busbar structure is insulated from said semiconductor body with insulating material between said busbar structure and said semiconductor body.

31. A photovoltaic device as recited in claim 30 wherein said insulating layer comprises material selected from the group consisting of natural and synthetic polymer material, insulating oxides, insulating organic material, and insulating carbides.

32. A photovoltaic device as recited in claim 30 wherein said insulating layer is substantially transparent.

33. A photovoltaic device as recited in claim 29 where said bus grid structure is in electrical contact with said transparent conductive layer and said bus grid structure includes a plurality of grid fingers for collecting current and a busbar structure for carrying current collected by said grid fingers, each of said grid fingers being electrically resistively connected to said busbar structure to reduce the current carrying capability between each of said grid fingers and said busbar structure so that the amount of current which can be carried between any of said grid fingers and said busbar structure is limited for each grid finger to an amount of current which is about five times or less than the maximum amount of current which can be produced by the area of photovoltaic device from which that particular grid finger collects current.

34. A photovoltaic device as recited in claim 33 wherein said resistive connections comprise ink having a desired resistance.

35. A photovoltaic device as recited in claim 34 wherein said resistive connections are formed by screen printing.

36. A photovoltaic device as recited in claim 23 wherein said transparent conductive layer is substantially continuous.

37. A photovoltaic device as recited in claim 23 wherein said transparent conductive layer is discontinuous.

38. A photovoltaic device as recited in claim 23 further comprising a back reflector layer.

39. A photovoltaic device as recited in claim 23 wherein said semiconductor body comprises amorphous semiconductor material.

40. A photovoltaic device comprising:
an electrically conductive substrate layer;
a semiconductor body deposited on said substrate layer;
a transparent conductive layer over at least a portion of said semiconductor body;
a bus grid structure in electrical contact with said conductive layer, said bus grid structure including a plurality of grid fingers for collecting current and busbar structure for carrying current collected by said grid fingers, each of said grid fingers being electrically resistively connected to said busbar structure to reduce the current carrying capability of each of said grid fingers between said busbar structure so that the amount of current which can be carried between any of said grid fingers and said busbar structure is limited for each grid finger to an amount of current which is about five times or less than the maximum amount of current which can be produced by the area of the photovoltaic device from which current that particular grid finger collects current.

41. A photovoltaic device as recited in claim 40 wherein said semiconductor body includes at least one triad of layers, said at least one triad of layers comprising a p-conductivity layer, an intrinsic layer, and an n-conductivity layer.

42. A photovoltaic device as recited in claim 41 wherein said at least one triad of layers comprise amorphous semiconductor material.

43. A photovoltaic device as recited in claim 40 wherein said transparent conductive layer is substantially discontinuous.

44. A photovoltaic device as recited in claim 40 wherein said transparent conductive layer is discontinuous.

45. A photovoltaic device as recited in claim 40 furthre comprising a back reflector layer between said electrically conductive substrate layer and said semiconductor body.

46. A photovoltaic device as recited in claim 40 wherein said resistive connections comprise ink having a desired resistance.

47. A photovoltaic device as recited in claim 40 wherein at least a portion of said bus grid structure is formed by screen printing.

48. A photovoltaic device as recited in claim 40 wherein at least a portion of said bus grid structure is formed by electroplating.

49. A photovoltaic device as recited in claim 40 wherein at least a portion of said bus grid structure is formed by vacuum deposition.

50. A photovoltaic device as recited in claim 40 wherein said at least a portion of said bus grid structure is formed by sputtering.

51. A photovoltaic device as recited in claim 40 wherein said transparent conductive layer has a relatively high sheet resistance for reducing the current sinking caused by any shorts in the photovoltaic device, the resistivity of said conductive layer being at least about 300 ohms/square.

52. A photovoltaic device as recited in claim 51 wherein the resistance of said transparent conductive layer is about 1,000 ohms/square.

53. A photovoltaic device as recited in claim 51 wherein said transparent comprises oxide material.

54. A photovoltaic device as recited in claim 51 wherein said transparent conductive layer comprises material selected from the group consisting of aluminum and noble metals.

55. A photovoltaic device as recited in claim 40 wherein said semiconductor body comprises amorphous semiconductor material.

56. A photovoltaic device comprising:
an electrically conductive substrate layer;
a semiconductor body deposited over said substrate layer;
a transparent conductive layer over at least a portion of said semiconductor body for facilitating collection of electrical current produced by the solar cell;
a bus grid structure, in contact with said transparent conductive layer, said bus grid structure having a plurality of grid fingers arrayed in a buffered pattern and a busbar structure for carrying current collected by said grid fingers, each of said grid fingers being electrically connected to said busbar structure whereby the current carrying capability of said grid fingers to said busbar structure is limited for each particular grid finger to an amount of current which is about five times or less than the amount of current which is produced by the area of the photovoltaic device for which that particular grid finger collects current.

57. A photovoltaic device as recited in claim 56 wherein said buffered pattern comprises unbranched grid fingers of varying length, each of said grid fingers having about the same end-to-end resistance.

58. A photovoltaic device as recited in claim 57 wherein the desired end-to-end resistance of the grid fingers is provided by controlling the cross-sectional area of each of said grid fingers.

59. A photovoltaic device as recited in claim 56 wherein said semiconductor body includes at least one triad of layers, said at least one triad of layers comprising a p-conductivity layer, an intrinsic layer, and an n-conductivity layer.

60. A photovoltaic device as recited in claim 59 wherein said at least one triad of layers comprises amorphous semiconductor material.

61. A photovoltaic device as recited in claim 56 wherein said semiconductor body comprises amorphous semiconductor material.

62. A photovoltaic device as recited in claim 56 wherein said transparent conductive layer is substantially continuous.

63. A photovoltaic device as recited in claim 56 wherein said transparent conductive layer is discontinuous.

64. A photovoltaic device as recited in claim 56 wherein said transparent conductive layer has a relatively high sheet resistance through said transparent conductive layer for reducing the current sinking caused by a short in the solar cell, the sheet resistance of said transparent conductive layer being at least about 300 ohms/square.

65. A photovoltaic device as recited in claim 64 wherein said transparent conductive layer has a resistance through said layer of about 1,000 ohms square.

66. A photovoltaic device as recited in claim 56 wherein said resistive connections comprise ink having a desired resistance.

67. A photovoltaic device as recited in claim 56 wherein at least a portion of said bus grid structure is screen printing.

68. A photovoltaic device as recited in claim 56 wherein at least a portion of said bus grid structure is formed by electroplating.

69. A photovoltaic device as recited in claim 56 wherein at least a portion of said bus grid structure is formed by vacuum deposition.

70. A photovoltaic device comprising:
an electrically conductive substrate layer;
a semiconductor body deposited on said substrate layer;
a transparent conductive layer over at least a portion of said semiconductor body;
a bus-grid structure in electrical contact with said transparent conductive layer, said bus-grid structure including a plurality of grid fingers for collecting current and a busbar structure for carrying current collected by said grid fingers, each of said grid fingers being electrically connected to said busbar structure with a separate destructible connection such that if the amount of current carried between a grid finger and the busbar structure is about five times the maximum amount of current produced by the photovoltaic device which can be collected relative to each grid finger, its destructible connection to the busbar structure terminates.

71. A photovoltaic device as recited in claim 70 wherein said destructible connection comprises fusible material.

72. A photovoltaic device as recited in claim 71 wherein said fusible material comprises fusible metal.

73. A photovoltaic device as recited in claim 72 wherein said fusible metal is selected from the group consisting of tin, lead, bismuth, and alloys thereof.

74. A photovoltaic device as recited in claim 70 wherein said semiconductor body includes at least one triad of layers, said at least one triad of layers comprising a p-conductivity layer, an intrinsic layer and an n-conductivity layer.

75. A photovoltaic device as recited in claim 74 wherein said at least one triad of layers comprises amorphous semiconductor material.

76. A photovoltaic device as recited in claim 70 wherein said semiconductor body comprises amorphous semiconductor material.

77. A photovoltaic device as recited in claim 70 wherein said transparent conductive layer is substantially continuous.

78. A photovoltaic device as recited in claim 77 wherein said continuous transparent conductive layer has a relatively high sheet resistance for reducing the current sinking caused by any shorts in the photovoltaic device, the resistance of said transparent conductive layer being at least about 300 ohms/square.

79. A photovoltaic device as recited in claim 78 said transparent layer has a resistance of about 1,000 ohms/square.

80. A photovoltaic device as recited in claim 78 wherein said transparent conductive layer comprises oxide material, or ultra thin metal films selected from the group consisting of aluminum and noble metals.

81. A photovoltaic device as recited in claim 70 wherein said transparent conductive layer is discontinuous.

82. A photovoltaic device as recited in claim 70 further comprising a back reflector layer between said electrically conductive substrate layer and said semiconductor body.

83. A photovoltaic device as recited in claim 70 wherein said bus grid structure comprises buffered bus grid fingers.

84. A photovoltaic device as recited in claim 70 wherein said destructible connections are formed by sputtering.

85. A photovoltaic device as recited in claim 70 wherein at least a portion of said bus grid structure is formed by screen printing.

86. A photovoltaic device as recited in claim 70 wherein at least a portion of said bus grid structure is formed by electroplating.

87. A photovoltaic device as recited in claim 20 wherein at least a portion of said bas grid structure is formed by vacuum deposition.

88. A photovoltaic device as recited in claim 70 wherein the current carrying portions of said bus grid structure are electrically insulated from said semiconductor body.

89. A photovoltaic device as recited in claim 88 wherein a layer of electrically insulating material is provided between said current carrying portions of said bus grid structure and said semiconductor body for electrically insulating the current carrying portions of said bus grid structure from said semiconductor body.

90. A photovoltaic device as recited in claim 89 wherein said layer of insulating material is substantially transparent.

91. A photovoltaic device as recited in claim 70 further comprising a back reflector layer between said electrically conductive substrate layer and said semiconductor body.

92. A method for fabricating a photovoltaic device that includes a bus-grid structure wherein the bus-grid structure comprises a current collecting portion including a plurality of grid fingers and a current carrying portion for carrying current collected by the grid fingers, comprising:
depositing a semiconductor body over an electrically conductive substrate;
depositing a transparent conductive layer over at least a portion of said semiconductor body;
depositing insulating material to form an insulating layer upon said semiconductor body in a pattern and location corresponding to the entirety of the areas in which the current carrying portion of said bus-grid structure is to be deposited; and
thereafter depositing the current carrying portion of said bus-grid structure so that the current carrying portion is electrically insulated from said semiconductor body.

93. A method as recited in claim 92 further comprising depositing the current collection portion of said bus-grid structure in electrical contact with said conductive layer.

94. A method as recited in claim 92 wherein said conductive layer is deposited prior to depositing said insulating material.

95. A method as recited in claim 92 wherein said insulating layer is substantially transparent.

96. A method as recited in claim 95 wherein said insulating layer covers an area of the photovoltaic device slightly larger than the area of the photovoltaic device covered by the current carrying portion of said bus grid structure.

97. A method as recited in claim 92 wherein the photovoltaic device has an area of about one hundred square centimeters or more.

98. A method as recited in claim 92 wherein said semiconductor body comprises amorphous semiconductor material.

99. A method as recited in claim 92 wherein the said transparent conductive layer has a sheet resistance of at least about 300 ohms/square.

100. A method of fabricating a photovoltaic device that includes a bus grid structure wherein the bus grid comprises a current collecting portion including a plurality of grid fingers and a current carrying portion for carrying current collected by the grid fingers comprising:

depositing a semiconductor body over an electrically conductive substrate;

depositing a transparent conductive layer over at least a portion of said semiconductor body; and thereafter depositing the current collecting and current carrying portions of said bus grid structure, including said grid fingers, so that the current collecting portion is in electrical contact with said conductive layer, and wherein said grid fingers are electrically resistively connected to said current carrying portion so that the current carrying capability of each of said grid fingers between said current carrying portion is about five times or less than the amount of current which is produced by the area of the photovoltaic device for which a particular grid finger collects current.

101. A method as recited in claim 100 wherein the photovoltaic device has an area of about one hundred square centimeters or more.

102. A method as recited in claim 100 wherein said semiconductor body comprises amorphous semiconductor material.

103. A method as recited in claim 100 further comprising depositing insulating material to form an insulating layer in a pattern and location corresponding to the areas in which the current carrying portion of said bus grid structure is to be deposited wherein the current carrying portion of said bus grid structure is deposited over said insulating layer so that the current carrying portion is electrically insulated from said semiconductor body.

104. A method as recited in claim 103 wherein said insulating layer is substantially transparent.

105. A method as recited in claim 104 wherein said insulating layer covers an area of the photovoltaic device slightly larger than the area of the photovoltaic device covered by the current carrying portion of said bus grid structure.

* * * * *